(12) United States Patent
Yoshii et al.

(10) Patent No.: US 10,817,696 B2
(45) Date of Patent: Oct. 27, 2020

(54) FINGERPRINT SENSOR PACKAGE AND DISPLAY DEVICE INCLUDING THE SAME

(71) Applicant: SAMSUNG DISPLAY CO., LTD., Yongin-si, Gyeonggi-Do (KR)

(72) Inventors: Katsumasa Yoshii, Suwon-si (KR); Ji Hun Ryu, Hwaseong-si (KR); Yun Ho Kim, Hwaseong-si (KR); Il Nam Kim, Hwaseong-si (KR); Han Yung Jung, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 177 days.

(21) Appl. No.: 16/115,164

(22) Filed: Aug. 28, 2018

(65) Prior Publication Data
US 2019/0278968 A1 Sep. 12, 2019

(30) Foreign Application Priority Data

Mar. 6, 2018 (KR) .......................... 10-2018-0026517

(51) Int. Cl.
| | |
|---|---|
| *G06K 9/28* | (2006.01) |
| *G06K 9/00* | (2006.01) |
| *G02F 1/1333* | (2006.01) |
| *G06F 3/041* | (2006.01) |
| *H01L 29/786* | (2006.01) |
| *H01L 27/12* | (2006.01) |
| *G02F 1/133* | (2006.01) |
| *G02F 1/1345* | (2006.01) |

(52) U.S. Cl.
CPC ....... *G06K 9/0004* (2013.01); *G02F 1/13338* (2013.01); *G06F 3/0412* (2013.01); *G06K 9/00053* (2013.01); *H01L 27/1214* (2013.01); *H01L 29/786* (2013.01); *G02F 1/13454* (2013.01); *G02F 2001/13312* (2013.01); *H01L 27/1225* (2013.01); *H01L 27/1251* (2013.01)

(58) Field of Classification Search
CPC .......................... G06K 9/0004–9/00046; G06K 9/00006–9/0012
See application file for complete search history.

(56) References Cited

U.S. PATENT DOCUMENTS

| | | | |
|---|---|---|---|
| 2017/0161544 A1* | 6/2017 | Fomani | ...................... G01J 1/08 |
| 2019/0026530 A1* | 1/2019 | Wu | ...................... G06K 9/0004 |

FOREIGN PATENT DOCUMENTS

| | | |
|---|---|---|
| JP | 10-289304 | 10/1998 |
| JP | 11-53523 | 2/1999 |
| JP | 4201191 | 12/2008 |
| JP | 4253826 | 4/2009 |
| JP | 6069822 | 2/2017 |

* cited by examiner

*Primary Examiner* — Brian Werner
(74) *Attorney, Agent, or Firm* — F. Chau & Associates, LLC

(57) ABSTRACT

A display device includes a base, a photosensor disposed on a surface of the base, a light emitting element disposed on the photosensor that includes a bottom electrode, an upper electrode and a light emitting layer interposed between the bottom electrode and the upper electrode, and a light condenser disposed on the light emitting element. The light condenser does not overlap the bottom electrode in a plan view.

19 Claims, 15 Drawing Sheets

FINGERPRINT SENSOR PACKAGE AND DISPLAY DEVICE INCLUDING THE SAME

This application claims priority under 35 U.S.C. § 119 from, and the benefit of, Korean Patent Application No. 10-2018-0026517, filed on Mar. 6, 2018 in the Korean Intellectual Property Office, the contents of which are herein incorporated by reference in their entirety.

TECHNICAL FIELD

Embodiments of present disclosure are directed to a fingerprint sensor package and a display device including the same.

DISCUSSION OF THE RELATED ART

With the development of multimedia, display devices are becoming increasingly important. Accordingly, various types of display devices, such as liquid crystal displays and organic light emitting displays, are being developed.

As applications of display devices become more diverse, display devices need to perform additional functions, such as sensing functions, in addition to displaying an image. For example, a display device may include one or more touch sensors that can sense a user's touch. For example, the touch sensors may include a touch position sensor that senses a touch position, a touch pressure sensor that senses whether a touch operation has been accompanied by pressure, or a touch fingerprint sensor that senses a fingerprint of a user performing a touch operation.

A display device that includes such touch sensors can be incorporated into portable electronic devices such as smartphones, smart watches, tablet PCs or notebook computers, or to large electronic devices such as televisions, monitors or digital information displays.

SUMMARY

To reduce the thickness and weight of a display device, improve durability and reduce manufacturing costs, a display device includes a display panel having an embedded touch sensor. A method of embedding a fingerprint sensor package including a photosensor in a display panel can be considered. However, there is a limit to improving the contrast of fingerprint information obtained by a photosensor.

Embodiments of the present disclosure can provide a display device capable of obtaining clear fingerprint information with improved contrast.

Embodiments of the present disclosure can also provide a fingerprint sensor package capable of obtaining clear fingerprint information with improved contrast.

However, embodiments of the present disclosure are not limited to those set forth herein. The above and other features of embodiments of the present disclosure will become more apparent to one of ordinary skill in the art to which the present disclosure pertains by referencing the detailed description of the present disclosure given below.

According to an embodiment of the present disclosure, there is provided a display device. The display device includes: a base; a photosensor disposed on a surface of the base; a light emitting element disposed on the photosensor that comprises a bottom electrode, an upper electrode and a light emitting layer interposed between the bottom electrode and the upper electrode; and a light condenser disposed on the light emitting element, wherein the light condenser does not overlap the bottom electrode in a plan view.

In an exemplary embodiment, the display device furthers include a pixel defining layer disposed on the photosensor that has an opening that partially exposes the bottom electrode, and the light condenser is disposed on the pixel defining layer and overlaps the pixel defining layer. In an exemplary embodiment, the light condenser overlaps the upper electrode and is not disposed in a light emitting area of the display device. The photosensor overlaps the bottom electrode and the light emitting layer.

In an exemplary embodiment, the photosensor receives light focused by the light condenser and at least a portion of light emitted from the light emitting layer and then reflected by a fingerprint of a user.

In an exemplary embodiment, a focus of the light condenser for light incident from above the light condenser is located below the surface of the base.

In an exemplary embodiment, the display device furthers include a cover glass disposed on the light condenser and receives the fingerprint of the user. The photosensor receives light propagating at an angle of 41.0 to 48.0 degrees with respect to a normal to a surface of the cover glass of the light reflected by the fingerprint of the user.

In an exemplary embodiment, the display device further includes a reflective layer disposed between the base and the light emitting element that at least partially overlaps the light condenser, and a thin film transistor disposed on the surface of the base that is electrically connected to the light emitting element.

In an exemplary embodiment, the display device further includes: a first step difference compensating layer disposed between the thin film transistor and the light emitting element that includes a first contact hole; and a second step difference compensating layer disposed between the first step difference compensating layer and the light emitting element that includes a second contact hole connected to the first contact hole and is in contact with the bottom electrode. The reflective layer is disposed between the first step difference compensating layer and the second step difference compensating layer.

In an exemplary embodiment, the reflective layer at least partially overlaps the bottom electrode and the light emitting layer.

In an exemplary embodiment, the reflective layer overlaps the thin film transistor and does not overlap the photosensor.

In an exemplary embodiment, the photosensor receives light focused by the light condenser, the light focused by the light condenser propagates toward the reflective layer and is reflected by the reflective layer, the light reflected by the reflective layer propagates toward the bottom electrode and is reflected by the bottom electrode, and the light reflected by the bottom electrode propagates toward the photosensor.

In an exemplary embodiment, the display device further includes a light-shielding pattern layer disposed between the base and the reflective layer and that includes a pinhole, wherein the pinhole does not overlap the reflective layer and overlaps the light emitting element.

In an exemplary embodiment, the thin film transistor is a top gate type first thin film transistor that comprises a first gate electrode, a first active layer, a first drain electrode and a first source electrode. The photosensor comprises a bottom gate type second thin film transistor that includes a second gate electrode, a second active layer, a second drain electrode and a second source electrode, and the reflective layer is insulated from the first thin film transistor and the second thin film transistor.

In an exemplary embodiment, the first thin film transistor and the second thin film transistor are insulated from each other, the first gate electrode and the second gate electrode are disposed in different layers, and the first drain electrode, the first source electrode, the second drain electrode and the second source electrode are disposed in the same layer.

In an exemplary embodiment, the first gate electrode and the second gate electrode are electrically connected to each other.

In an exemplary embodiment, the display device includes a plurality of photosensors, plurality of light emitting layers and a plurality of light condensers, and the photosensors, the light emitting layers and the light condensers may be respectively spaced apart from each other in a first direction and a second direction that intersects the first direction, the light condensers focus light propagating in a first (X) direction.

In an exemplary embodiment, the display device further includes a pressure sensor that overlaps the photosensors, the light emitting layers and the light condensers. The pressure sensor is spaced apart from the light emitting element with the photosensor interposed between the pressure sensor and the light emitting element.

According to an embodiment of the present disclosure, there is provided a display device. The display device includes: a base; a photosensor disposed on a surface of the base; a light emitting element disposed on the photosensor; a light condenser disposed on the light emitting element; and at least one reflective layer disposed between the base and the light emitting element that at least partially overlaps the light condenser. The photosensor receives light focused by the light condenser and reflected by the at least one reflective layer and a lower surface of the light emitting element.

In an exemplary embodiment, the light emitting element includes a bottom electrode, an upper electrode and a light emitting layer interposed between the bottom electrode and the upper electrode, and the light focused by the light condenser is reflected the reflective layer and the bottom electrode as said light propagates to the photosensor.

According to an embodiment of the present disclosure, there is provided a fingerprint sensor package. The fingerprint sensor package includes: a plurality of light sources that are spaced apart from each other in a first direction and a second direction that intersects the first direction and emit light toward at least front surfaces of the light sources; a plurality of light condensers that are disposed on front surface sides of the light sources, are spaced apart from each other in the first direction, and that focus light propagating in the first direction; and a plurality of photosensors that are disposed on rear surface sides of the light sources, are spaced apart from each other in the first direction, and that receive light focused by the light condensers.

DETAILED DESCRIPTION OF EXEMPLARY EMBODIMENTS

It will be understood that when an element or layer is referred to as being "on," "connected to" or "coupled to" another element or layer, the element or layer can be directly on, connected or coupled to another element or layer or intervening elements or layers. As used herein, connected may refer to elements being physically, electrically and/or fluidly connected to each other.

Like numbers may refer to like elements throughout the specification and the drawings.

As used herein, a first direction X denotes any one direction in a plane, a second direction Y denotes a direction intersecting the first direction X in the plane, and a third direction Z denotes a direction perpendicular to the plane.

Hereinafter, exemplary embodiments will be described with reference to the accompanying drawings.

Figure 1:
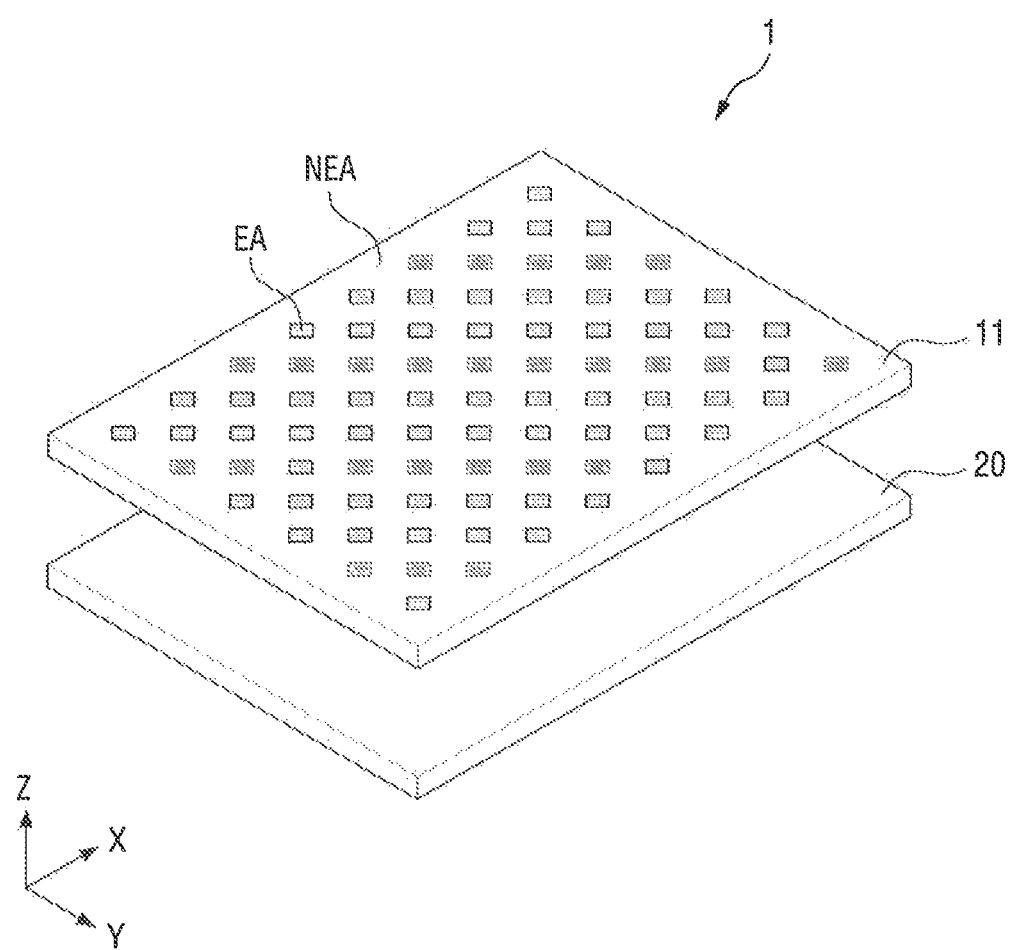
FIG. 1 is an exploded perspective view of a display device according to an embodiment.

FIG. 1 is an exploded perspective view of a display device 1 according to an embodiment.

Referring to FIG. 1, the display device 1 according to a current embodiment includes a display panel 11 and a pressure sensor 20 disposed below the display panel 11.

In an embodiment, the display panel 11 is an organic light emitting display panel that includes a plurality of light emitting areas EA spaced apart from each other in a first direction X and a second direction Y and surrounded by a no-light emitting area NEA. The light emitting areas EA emit light that substantially contributes to the image display, and the non-light emitting area NEA is an area other than the light emitting areas EA. Each of the light emitting areas EA defines one pixel. As used herein, the term 'pixels' refer to the single regions into which a display device or a display area is divided in a plan view for image display and which are recognized by a viewer, and one pixel expresses a predetermined primary color. Examples of primary colors include red, green and blue.

According to a current embodiment, the light emitting areas EA are arranged substantially regularly in a plane. For example, the light emitting areas EA each have a substantially diamond or quadrilateral shape in a plan view and are periodically arranged along directions, such as diagonal directions that intersects the first direction X and the second direction Y, the are parallel to the sides of the diamond shape.

The display panel 11 will now be described in more detail by additionally referring to FIGS. 2 and 3.

Figure 2:
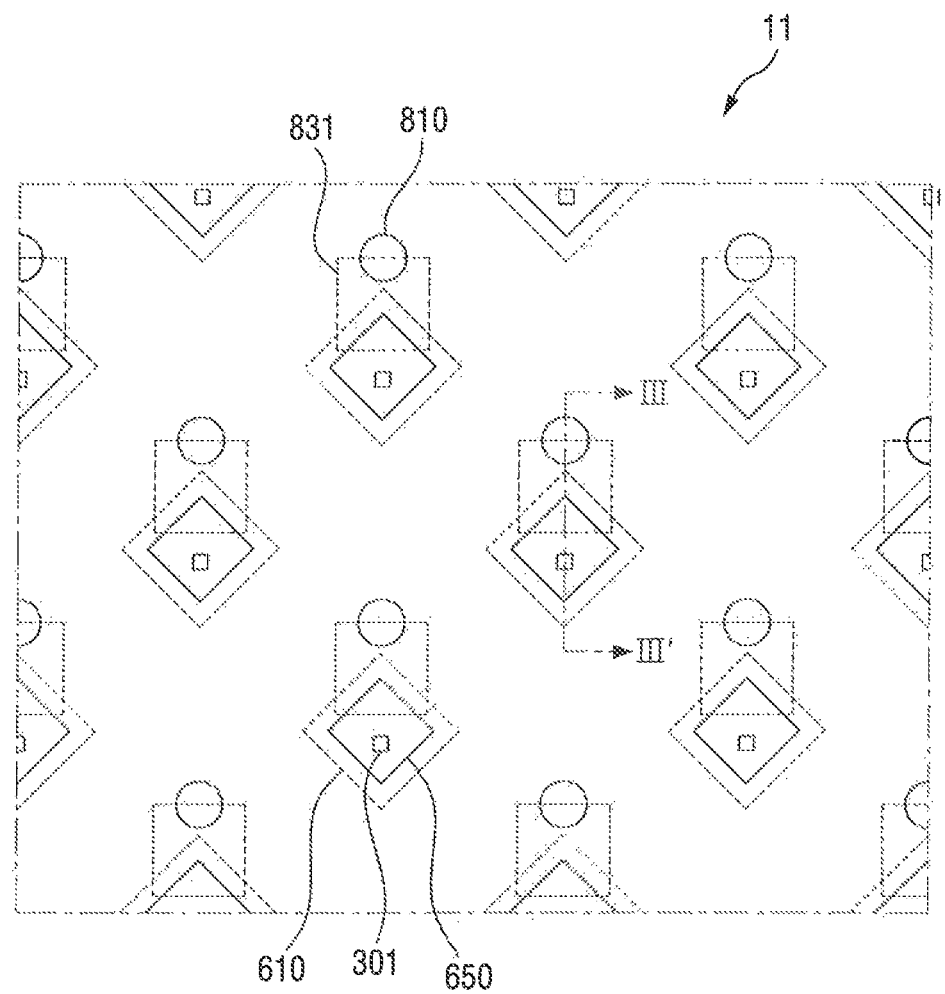
FIG. 2 is a plan view of a display panel of a display device of FIG. 1.
Figure 2:
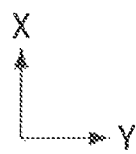

FIG. 2 is a plan view of the display panel 11 of the display device 1 of FIG. 1 that illustrates a planar arrangement of a light emitting layer 650, an anode 610, a photosensor 301, a reflective layer 831, and a light condenser 810. FIG. 3 is a cross-sectional view of the display panel 11 of FIG. 2 taken along the line III-III'.

Figure 3:
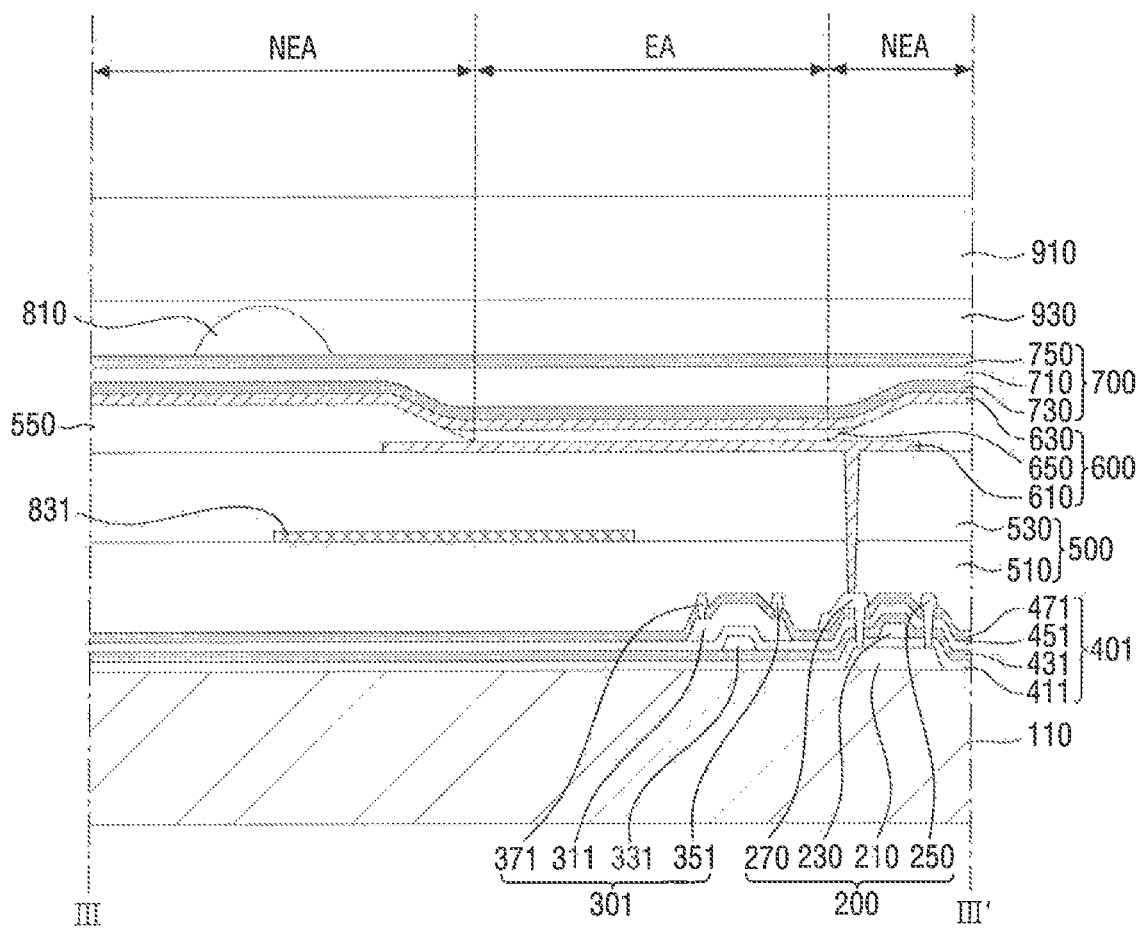
FIG. 3 is a cross-sectional view of a display panel of FIG. 2, taken along the line III-III'.

Referring FIGS. 2 and 3, the display panel 11 of the display device 1 according to a current embodiment includes a base 110, the photosensor 301, a light emitting element 600, the light condenser 810 and the reflective layer 831.

According to a current embodiment, the base 110 provides a substrate on which the photosensor 301, the light emitting element 600, etc., can be stably disposed. An upper surface of the base 110 lies in a plane parallel to the first direction X and the second direction Y The base 110 may be a transparent or opaque insulating plate or film. For example, the base 110 may include glass, quartz, or a polymer material such as imide resin, carbonate resin or acrylic resin. The base 110 may be flexible.

According to a current embodiment, a thin film transistor 200 is disposed on the base 110. In FIG. 3, only the thin film transistor 200 and the photosensor 301 are illustrated for ease of description. However, in some embodiments, a plurality of thin film transistors, a plurality of wirings that transmit signals, a plurality of auxiliary electrodes that form a capacitor or a bridge can be further disposed between the base 110 and the light emitting element 600.

According to a current embodiment, the thin film transistor 200 is electrically connected to the light emitting element 600. The thin film transistor 200 includes a first active layer 210 that forms a channel, a first gate electrode 230 that is a control terminal, a first drain electrode 250 that is an input terminal and a first source electrode 270 that is an output terminal. The thin film transistor 200 may be a top gate type thin film transistor in which the first gate electrode 230 is located above the first active layer 210.

For example, according to a current embodiment, the thin film transistor 200 may be a driving transistor that controls the magnitude of current provided to the light emitting element 600 in a specific pixel. Alternatively, the thin film transistor 200 may be a switching transistor that controls an on/off state of a specific pixel, a compensation transistor that compensates a driving signal, an initialization transistor that receives an initialization signal through its gate electrode, or an emission control transistor that receives an emission control signal through its gate electrode.

According to a current embodiment, the first active layer 210 is disposed on the base 110. FIG. 3 shows the first active layer 210 as being disposed directly on the base 110. However, in an embodiment, one or more inorganic layers are further interposed between the base 110 and the first active layer 210. The first active layer 210 includes a semiconductor. For example, the first active layer 210 includes polycrystalline silicon. The first active layer 210 may include monocrystalline silicon, amorphous silicon, or a non-silicon-based material such as an oxide semiconductor.

According to a current embodiment, the first active layer 210 has a channel region with a channel through which electrons or holes can flow according to a voltage applied to the first gate electrode 230, i.e., the control terminal. In some embodiments, the first active layer 210 is partially conductive. For example, the first active layer 210 further includes a drain region and a source region spaced apart by the channel region, and each of the drain region and the source region has a higher electrical conductivity than the channel region. That is, electrons or holes from the drain region flow toward the source region through the channel region, or electrons or holes provided from the source region flow toward the drain region through the channel region.

According to a current embodiment, the first gate electrode 230 is disposed on the first active layer 210. The first gate electrode 230 at least partially overlaps the channel region of the first active layer 210. The first gate electrode 230 may include aluminum, molybdenum, copper, titanium, or an alloy of these materials. The first gate electrode 230 may be a single layer or may have a stacked structure that includes a plurality of layers.

According to a current embodiment, the first gate electrode 230 forms the control terminal to which a control signal for the thin film transistor 200 is transmitted. In an embodiment in which the thin film transistor 200 is a driving transistor, the first gate electrode 230 is electrically connected to an output terminal of a switching transistor which controls an on/off state of a specific pixel. In addition, a control terminal and an input terminal of the switching transistor can be electrically connected to a scan wiring and a data wiring, respectively.

According to a current embodiment, the first drain electrode 250 and the first source electrode 270 are disposed on the first active layer 210. The first drain electrode 250 and the first source electrode 270 are electrically connected to the first active layer 210 via through holes formed in an interlayer insulating layer 401, respectively. Each of the first drain electrode 250 and the first source electrode 270 may include aluminum, molybdenum, copper, titanium, or an alloy of these materials. Each of the first drain electrode 250 and the first source electrode 270 may be a single layer or may have a stacked structure that includes a plurality of layers.

According to a current embodiment, the first drain electrode 250 forms the input terminal which receives an input signal for the thin film transistor 200, and the first source electrode 270 forms the output terminal of the thin film transistor 200 and is electrically connected to the anode 610. In an embodiment in which the thin film transistor 200 is a driving transistor, the first drain electrode 250 is electrically connected to a driving voltage wiring which transmits a driving voltage.

In addition, according to a current embodiment, the photosensor 301 is disposed on the base 110. The photosensor 301 receives incident light to determine the intensity of light or obtain information about the shape, position, movement, etc. of a specific object. For example, the photosensor 301 can detect an electrical signal that corresponds to the intensity of received light and obtain image information of a user's fingerprint shape, that is, a fingerprint pattern. More specifically, the photosensor 301 detects an electrical signal that corresponds to the intensity of received light and obtains brightness information of ridges and valleys of a user's fingerprint or image information of a fingerprint pattern based on the brightness information. In some embodiments, the photosensor 301 overlaps the light emitting element 600. For example, there may be a plurality of photosensors 301 that are spaced apart from each other in the first direction X and the second direction Y and disposed in the light emitting areas EA of the plurality of light emitting layers 650, respectively.

In an embodiment, the photosensor 301 includes a phototransistor. Alternatively, the photosensor 301 includes a photodiode, a photoregister, etc.

According to a current embodiment, the photosensor 301 include a second gate electrode 331, a second active layer 311, a second drain electrode 351, and a second source electrode 371. In an embodiment in which the photosensor 301 is a phototransistor, the photosensor 301 is a bottom gate type thin film transistor in which the second gate electrode 331 is located below the second active layer 311. The photosensor 301 and the thin film transistor 200 are insulated from each other.

According to a current embodiment, the second gate electrode 331 forms a control terminal which receives a control signal for the photosensor 301. The second gate electrode 331 is spaced apart from the first gate electrode 230. For example, the second gate electrode 331 and the first gate electrode 230 are located on different layers with a second insulating layer 431 is interposed therebetween and do not overlap each other. The second gate electrode 331 and the first gate electrode 230 are insulated from each other to receive different signals. The second gate electrode 331 may include the same or a different material as the first gate electrode 230.

According to a current embodiment, the second active layer 311 is disposed on the second gate electrode 331. The second active layer 311 overlaps the anode 610, the light emitting layer 650 and a cathode 630 of the light emitting element 600. The second active layer 311 includes a semiconducting material. For example, the second active layer 311 includes amorphous silicon. The second active layer 311 may include polycrystalline silicon, monocrystalline silicon, or a non-silicon-based material such as an oxide semiconductor. When visible light is incident on the second active layer 311, the second active layer 311 is at least partially activated to be a conductor. For example, when light is incident on the second active layer 311, a channel is formed through which electrons and/or holes can flow from the second drain electrode 351 and the second source electrode 371, and the electrons and the holes recombine to generate excitons. The channel and the excitons of the second active layer 311 generate a different leakage current based on the intensity of received light.

According to a current embodiment, the second drain electrode 351 and the second source electrode 371 are disposed on the second active layer 311. The second drain electrode 351 and the second source electrode 371 are electrically connected to the second active layer 311 via through holes formed in a fourth insulating layer 471, respectively. The second drain electrode 351, the second source electrode 371, the first drain electrode 250, and the first source electrode 270 are located in the same layer. For example, the second drain electrode 351, the second source electrode 371, the first drain electrode 250, and the first source electrode 270 include the same material and are formed simultaneously through one process. The second drain electrode 351, the second source electrode 371, the first drain electrode 250, and the first source electrode 270 are insulated from each other.

According to a current embodiment, the interlayer insulating layer 401 is disposed on the base 110 to insulate layers from each other. For example, the interlayer insulating layer 401 includes a first insulating layer 411 disposed between the first active layer 210 and the first gate electrode 230 to insulate them from each other. That is, the first insulating layer 411 is a gate insulating layer of the thin film transistor 200. In addition, the interlayer insulating layer 401 includes a third insulating layer 451 interposed between the second gate electrode 331 and the second active layer 311. That is, the third insulating layer 451 is a gate insulating layer of the photosensor 301.

In addition, according to a current embodiment, the second insulating layer 431 is interposed between the first gate electrode 230 and the second gate electrode 331. That is, the first gate electrode 230 and the second gate electrode 331 may be located on different layers. The fourth insulating layer 471 is disposed between the second active layer 311 and both the second drain electrode 351 and the second source electrode 371 to insulate the active layer 3111 from each of the electrodes 351, 371. In addition, the second insulating layer 431, the third insulating layer 451 and the fourth insulating layer 471 insulate the first gate electrode 230 from both the first drain electrode 250 and the first source electrode 270.

According to a current embodiment, each of the first insulating layer 411, the second insulating layer 431, the third insulating layer 451, and the fourth insulating layer 471 includes an inorganic insulating material. Examples of inorganic insulating materials include silicon nitride, silicon oxide, silicon nitride oxide, and silicon oxynitride.

According to a current embodiment, a step difference compensating layer 500 is disposed on the interlayer insulating layer 401. The step difference compensating layer 500 has a step difference compensating function to at least partially compensate for a step formed by the thin film transistor 200 and the photosensor 301 and provide a space in which the light emitting element 600, etc., can be stably disposed. The step difference compensating layer 500 includes a first step difference compensating layer 510 and a second step difference compensating layer 530 stacked on each other. The material of the step difference compensating layer 500 is not particularly limited as long as it has high light transmittance, can compensate a step difference, and is an insulator. For example, the step difference compensating layer 500 may include an organic material such as acrylic resin, epoxy resin, imide resin, cardo resin, or ester resin. The material of the first step difference compensating layer 510 and the material of the second step difference compensating layer 530 may be the same or different. The first step difference compensation layer 510 primarily compensates for a step difference between elements disposed on the base 110, and the second step difference compensation layer 530 secondarily compensates for the step difference. Therefore, an upper surface of the second step difference compensating layer 530 is substantially flat. Accordingly, a space in which the light emitting device 600 is stably disposed is provided, and the light emitting layer 650 can have a uniform thickness.

In addition, according to a current embodiment, the first step difference compensating layer 510 has a first contact hole, and the second step difference compensating layer 530 has a second contact hole connected to the first contact hole. The first contact hole and the second contact hole partially expose the first source electrode 270 of the thin film transistor 200. The thin film transistor 200 and the light emitting element 600 are electrically connected to each other through the first contact hole and the second contact hole.

In some embodiments, the reflective layer 831 is disposed between the first step difference compensating layer 510 and the second step difference compensating layer 530. The reflective layer 831 has a predetermined area and reflects at least a portion of light collected by the light condenser 810, which will be described below. FIG. 2 illustrates as an example a case in which a plurality of reflective layers 831, each having a substantially quadrilateral shape in a plan view, are spaced apart from each other in the first direction X and the second direction Y.

According to a current embodiment, at least a portion of the reflective layer 831 is disposed in each of the light emitting areas EA. For example, at least a portion of the reflective layer 831 overlaps the anode 610, the light emitting layer 650 and the cathode 630 of the light emitting element 600. In addition, at least a portion of the reflective layer 831 overlaps the light condenser 810. On the other hand, the reflective layer 831 does not overlap the photosensor 301 and the thin film transistor 200. The material of the reflective layer 831 is not particularly limited as long as it can reflect visible light. For example, the reflective layer 831 may be made of an opaque metal such as lithium (Li), aluminum (Al), magnesium (Mg), silver (Ag), nickel (Ni), chromium (Cr), molybdenum, copper, titanium, or an alloy of these materials. The metallic reflective layer 831 is electrically insulated from the thin film transistor 200 and the photosensor 301. The function of the reflective layer 831 of a fingerprint sensor package according to the current embodiment will be described below.

According to a current embodiment, the light emitting element 600 is disposed on the step difference compensating layer 500. The light emitting element 600 include the anode 610, such as a bottom electrode, the cathode 630, such as a upper electrode spaced apart from the anode 610, and the light emitting layer 650 interposed between the anode 610 and the cathode 630. For example, the light emitting layer 650 is an organic light emitting layer that includes an organic light emitting material, and the light emitting element 600 is an organic light emitting element. The light emitting element 600 may emit only blue light, only green light, only red light, or white light, which is a mixture of blue, green and red light, according to the material or stacked structure of the light emitting layer 650.

According to a current embodiment, the anode 610 is a pixel electrode that is disposed in each pixel and which receives an independent driving signal. A portion of the anode 610 is inserted into the first contact hole and the second contact hole of the first step difference compensating layer 510 and the second step difference compensating layer 530 to be electrically connected to the first source electrode 270 of the thin film transistor 200.

According to a current embodiment, the anode 610 has a substantially diamond shape in a plan view. The anode 610 is disposed directly on the second step difference compensation layer 530. The anode 610 may be a transparent electrode, an opaque electrode, or a stacked structure of a transparent electrode and an opaque electrode. For example, the anode 610 has a stacked structure of an opaque electrode and a transparent electrode disposed on the opaque electrode. In this case, the opaque electrode is in contact with the second step difference compensating layer 530. Examples of a material that forms a transparent electrode include indium tin oxide (ITO), indium zinc oxide (IZO), zinc oxide and indium oxide, and examples of a material that forms a opaque electrode include lithium (Li), aluminum (Al), magnesium (Mg), silver (Ag), nickel (Ni) and chromium (Cr).

According to a current embodiment, the cathode 630 at least partially overlaps the anode 610 and is a common electrode disposed over a plurality of pixels without distinction between the pixels. That is, a plurality of light emitting elements 600 disposed in different pixels share the cathode 630 with each other. Like the anode 610, the cathode 630 may be a transparent electrode, an opaque electrode, or a stacked structure of a transparent electrode and an opaque electrode.

According to a current embodiment, the light emitting layer 650 is interposed between the anode 610 and the cathode 630. The light emitting layer 650 generates light by recombining holes and electrons received from the anode 610 and the cathode 630. For example, the holes and the electrons recombine in the light emitting layer 650 to generate excitons, and the excitons generate light as they decay from an excited state to a ground state. That is, the light emitting layer 650 is a light source that directly emits light. The light emitted from the light emitting layer 650 may contribute to image display or may function as a light source of the fingerprint sensor package. In an embodiment, the light emitted from the light emitting layer 650 functions as a light source of the fingerprint sensor package without contributing to the image display.

According to a current embodiment, the light emitting layer 650 includes a material that emits blue phosphorescent or fluorescent light, a material that emits green phosphorescent or fluorescent light, or a material that emits red phosphorescent or fluorescent light. The light emitting layer 650 is disposed in a pixel defining layer 550 that has an opening that will be described below. The light emitting layer 650 disposed in the opening of the pixel defining layer 550 defines each of the light emitting areas EA in a plan view. For example, the light emitting layer 650 has a substantially diamond shape in a plan view. In addition, there is a plurality of light emitting layers 650, and the light emitting layers 650 are spaced apart from each other in the first direction X and the second direction Y.

According to a current embodiment, a hole control assisting layer such as a hole injection layer, a hole transport layer or a hole blocking layer, an electron control assisting layer such as an electron injection layer, an electron transport layer or an electron blocking layer, or a charge generation assisting layer can be further disposed between the light emitting layer 650 and the anode 610 or between the light emitting layer 650 and the cathode 630 to improve the luminous efficiency of the light emitting element 600.

In some embodiments, the pixel defining layer 550 is further disposed on the anode 610. The light emitting layer 650 and the cathode 630 described above are disposed on the pixel defining layer 550. The pixel defining layer 550 is interposed between the anode 610 and the cathode 630 to insulate the anode 610 and the cathode 630 from each other and separates the light emitting areas EA from each other, in a plan view, the pixel defining layer 550 has an opening at least partially exposing the anode 610, and the light emitting layer 650 is disposed in the opening. That is, the light emitting layer 650 is surrounded by inner sidewalls of the opening of the pixel defining layer 550. The opening has a substantially diamond shape in a plan view. A plurality of openings are provided, and the openings are spaced apart from each other in the first direction X and the second direction Y The pixel defining layer 550 includes an organic material such as acrylic resin, epoxy resin, imide resin or ester resin.

According to a current embodiment, an encapsulating member 700 is disposed on the light emitting element 600. The encapsulating member 700 completely encapsulates the light emitting element 600 to prevent impurities such as moisture or air from penetrating from outside of the display device 1 to damage or denature the light emitting element 600. The encapsulating member 700 is a thin encapsulating layer that includes one or more inorganic encapsulating layers (710 and 750) and one or more organic encapsulating layers (730). The inorganic encapsulating layers (710 and 750) and the organic encapsulating layers (730) are alternately disposed. For example, the encapsulating member 700 includes a first inorganic encapsulating layer 710 disposed on the cathode 630, an organic encapsulating layer 730 disposed on the first inorganic encapsulating layer 710, and a second inorganic encapsulating layer 750 disposed on the first inorganic encapsulating layer 730. FIG. 3 illustrates as an example a case in which the encapsulating member 700 is composed of three layers. In some embodiments, the encapsulating member 700 further includes a siloxane-based encapsulating layer such as hexamethyldisiloxane. The encapsulating member 700 includes an encapsulating substrate containing a glass.

According to a current embodiment, the light condenser 810 is disposed on the encapsulating member 700. The light condenser 810 can focus or condense light by partially modulating the paths of light propagating in the first direction X. For example, the light condenser 810 can induce incident light to converge on one point, i.e. focusing, by partially refracting the incident light. FIG. 2 illustrates as an example a microlens light condenser 810 that is substantially circular in a plan view. The light condenser 810 may include a lens, such as a lenticular lens or a prism lens, that has an optical interface that focuses light propagating in the first direction X, or a birefringent structure that focuses light propagating in the first direction X. Light can also enter from above the light condenser. However, the light reflected from a finger propagates in the first direction X as a whole and enters the photosensor. A circular light condenser can also focus light propagating in the second direction Y, but the light focused in the second direction Y cannot enter the photosensor.

According to a current embodiment, a plurality of light condensers 810 are provided, and the light condensers 810 are spaced apart from each other in the first direction X and the second direction Y. Also, in a plan view, the light condenser 810 are not located in the light emitting areas EA but rather in the non-light emitting area NEA. The light condenser 810 does not overlap the light emitting layer 650 and the anode 610 of the light emitting element 600. The light condenser 810 focuses light propagating in the first direction X and are spaced apart from the light emitting layer 650 and the anode 610 in the first direction X. In addition, the light condenser 810 at least partially overlaps the cathode 630, the pixel defining layer 550 and the reflective layer 831.

In an embodiment in which the light emitting layer 650 of the light emitting element 600 emits light toward at least a front surface of the display panel 11, the light condenser 810 is disposed on a front surface side of the light emitting layer 650. FIG. 3 illustrates as an example a case in which the light condenser 810 is disposed on the encapsulating member 700. However, in an embodiment, the encapsulating member 700 may be disposed on the light condenser 810. The function of the light condenser 810 of the fingerprint sensor package according to the current embodiment will be described below.

According to a current embodiment, a cover glass 910 is disposed on the light condenser 810. The cover glass 910 is a window glass that covers an upper surface of the display panel 11 and the display device 1 to form the front exterior of the display device 1. In addition, the cover glass 910 forms a display surface of the display device 1 on which an image is displayed as well as a touch surface on which a user's touch operation, that is, a contact between the user and the display device 1, is made. For example, when a user performs a touch operation using a finger, a fingerprint pattern of the user is brought into contact with a front surface of the cover glass 910. A material of the cover glass 910 is not particularly limited as long as it has high light transmittance and high strength. For example, the cover glass 910 may include a glass, sapphire, or a polymer.

In some embodiments, an adhesive layer 930 is interposed between the cover glass 910 and the light condenser 810. The adhesive layer 930 contacts the encapsulating member 700 and the light condenser 810 and bonds the encapsulating member 700 and the light condenser 810 to the cover glass 910. A microlens-shaped light condenser 810 having a convex upper surface is at least partially inserted and bonded to the adhesive layer 930. The adhesive layer 930 may include an optical clear adhesive, an optically clear resin, or a pressure sensitive adhesive. In addition, a polarizing member may be further disposed between the adhesive layer 930 and the cover glass 910.

According to a current embodiment, the photosensor 301, the reflective layer 831, the light emitting element 600, and the light condenser 810 described above form a fingerprint sensor package. For example, in an embodiment in which the light emitting layer 650 of the light emitting element 600 emits light toward at least the upper surface of the display panel 11, the light condenser 810 is disposed on the front surface side of the light emitting layer 650, and the reflective layer 831 and the photosensor 301 are disposed on a rear surface side of the light emitting layer 650 to form a fingerprint sensor package. An operation of a fingerprint sensor package of the display panel 11 according to a current embodiment will now be described in more detail with reference to FIG. 4.

Figure 4:
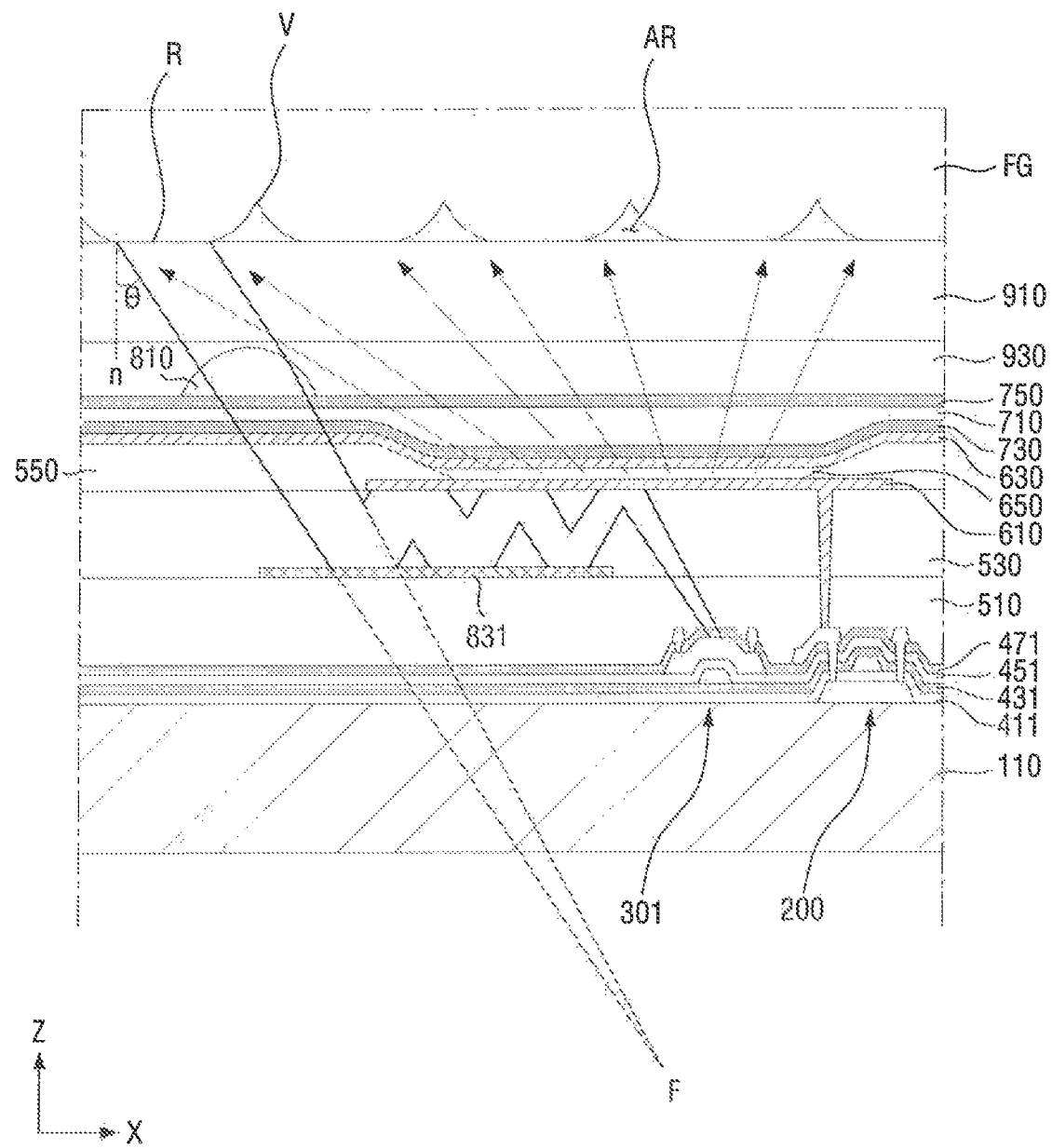
FIG. 4 illustrates operation of a fingerprint sensor package of a display panel of FIG. 3.

FIG. 4 illustrates operation of a fingerprint sensor package of the display panel 11 of FIG. 3.

Referring to FIG. 4, according to a current embodiment, the front surface of the cover glass 910 described above can contact an object, such as a user's finger FG, which performs a touch operation. Specifically, ridges R of a fingerprint pattern of the finger FG come into close contact with the cover glass 910, and an air gap AR is formed between each valley V between the ridges R and the cover glass 910. The photosensor 301 can obtain image information of the user's fingerprint pattern, for example, image information of only the ridges R.

According to a current embodiment, light emitted from the light emitting layer 650 of the light emitting element 600 propagates substantially toward the front surface of the display panel 11. The light propagating toward the front surface of the display panel 11 passes through the cover glass 910 to be diffusely reflected or specularly reflected by the finger FG of the user. That is, the light emitting layer 650 of the light emitting element 600 functions not only as a light source that emits light contributing to image display, but also as a light source of the fingerprint sensor package.

According to a current embodiment, the photosensor 301 and a fingerprint sensor package that includes the photosensor 301 detect only reflected light propagating at a predetermined incident angle θ to obtain fingerprint information, specifically, image information of the ridges R. The range of the incident angle θ of the reflected light received by the photosensor 301 is tuned by one or more of a focal distance of the light condenser 810, a vertical distance between the touch surface of the cover glass 910 and the light condenser 810, a vertical distance between the light condenser 810 and the reflective layer 831, a vertical distance between the reflective layer 831 and the anode 610, a vertical distance between the anode 610 and the photosensor 301, a length of the reflective layer 831 in the first direction X, a distance between the reflective layer 831 and the photosensor 301 in the first direction X, and the arrangement relationship between the above elements.

In an embodiment, a lower limit of the incident angle θ of the reflected light received by the photosensor 301 is about 410 degrees. The distribution of reflection angles of light reflected by the ridges R in close contact with the cover glass 910 is different from the distribution of reflection angles of light reflected by the valleys V spaced apart from the cover glass 910 by the air gaps AG. For example, light reflected by the valleys V forms an angle of less than ±4.10 degrees with respect to a normal n to a surface of the cover glass 910, and light reflected by the ridges R forms an angle of ±60.0 degrees or less with respect to the normal n. That is, light reflected at an angle of +41.0 to +60.0 degrees and at an angle of −41.0 to −60.0 degrees is light substantially reflected by the ridges R. Therefore, the photosensor 301 detects only reflected light with an incident angle θ of 41.0 degrees or more. This enables the photosensor 301 and the fingerprint sensor package to obtain clear image information of the ridges R, thereby improving the sensing sensitivity of the fingerprint sensor package.

In addition, according to a current embodiment, an upper limit of the incident angle θ of the reflected light received by the photosensor 301 is about 48.0 degrees. As described above, light reflected by the ridges R forms an angle of ±60.0 degrees or less with respect to the normal n, and the photosensor 301 can receive light that forms an angle of 41.0 degrees or more. In this case, of the light reflected by the ridges R, reflected light that forms an angle of more than 48.0 degrees interferes with reflected light that forms an angle of 41.0 degrees. That is, when light reflected by the ridges R and then received by the photosensor 301 contains a mixture of reflected light propagating at an angle of 41.0 to 48.0 degrees and reflected light propagating at an angle of 48.0 to 60.0 degrees, the image information obtained by a fingerprint sensor package that includes the photosensor 301 is blurry. Therefore, the photosensor 301 detects only reflected light propagating at an incident angle θ of 48.0 degrees or less. This enables the photosensor 301 and the fingerprint sensor package to obtain clearer image information, thereby improving the sensing sensitivity of the fingerprint sensor package.

In addition, according to a current embodiment, light reflected by the user's finger FG propagates toward the light condenser 810. As described above, the light condenser 810 partially refracts incident light to focus the light. That is, the photosensor 301 receives not the bundle of light, but the light focused by the light condenser 810, thereby improving the image contrast obtained by the photosensor 301 and the fingerprint sensor package.

In some embodiments, the light focused by the light condenser 810 propagates toward the reflective layer 831, and the reflective layer 831 reflects the focused light, in addition, the light reflected by the reflective layer 831 propagates toward the anode 610 of the light emitting element 600, and the anode 610 reflects the focused light again. The reflection by each of the reflective layer 831 and the anode 610 may be performed one or more times, and the light reflected by the anode 610 propagates toward the photosensor 301, specifically, toward the second active layer 311 of the photosensor 301.

As described above, according to a current embodiment, the light condenser 810 focuses the light to converge on one point. However, there are limits to reducing the focal distance of the light condenser 810, which can require an increase in the distance between the light condenser 810 and the photosensor 301. Although embodiments are not limited to the following case, an original focus F of the light condenser 810 for light incident on the light condenser 810 from above the light condenser 810 is located below the upper surface of the base 110. A fingerprint sensor package and the display panel 11 according to a current embodiment reflects at least a portion of focused light using the reflective layer 831 and the anode 610, and the photosensor 301 receives the light reflected by the reflective layer 831 and the anode 610. Therefore, it is possible to improve the image contrast obtained by the photosensor 301, reduce the vertical distance between the light condenser 810 and the photosensor 301, and make the display panel 11 thinner.

According to a current embodiment, the light condenser 810, the reflective layer 831 and the photosensor 301 of a fingerprint sensor package of the display panel 11 are disposed in each pixel. Thus, the fingerprint sensor package can obtain image information having a resolution corresponding to the resolution of the display panel 11. Accordingly, this improves the sensing sensitivity of the fingerprint sensor package. Alternatively, the light condenser 810, the reflective layer 831 and the photosensor 301 of the fingerprint sensor package may be disposed in only some pixels.

In addition, according to a current embodiment, the light condenser 810 and the photosensor 301 of the fingerprint sensor package are spaced apart from each other with the light emitting layer 650 of the light emitting element 600 interposed therebetween, and the photosensor 301 is disposed under the light emitting layer 650 and overlapped by the light emitting layer 650. That is, since the photosensor 301 can be placed in the light emitting areas EA, a reduction in the area of each of the light emitting areas EA of the display panel 11 can be minimized.

Figure 5:
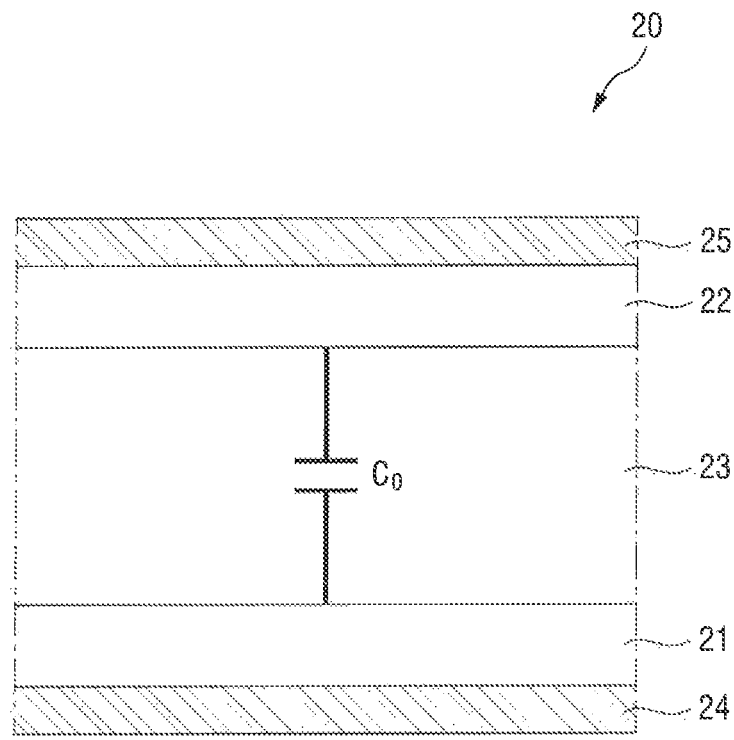
FIGS. 5 and 6 illustrate operation of a pressure sensor of FIG. 1.
Figure 6:
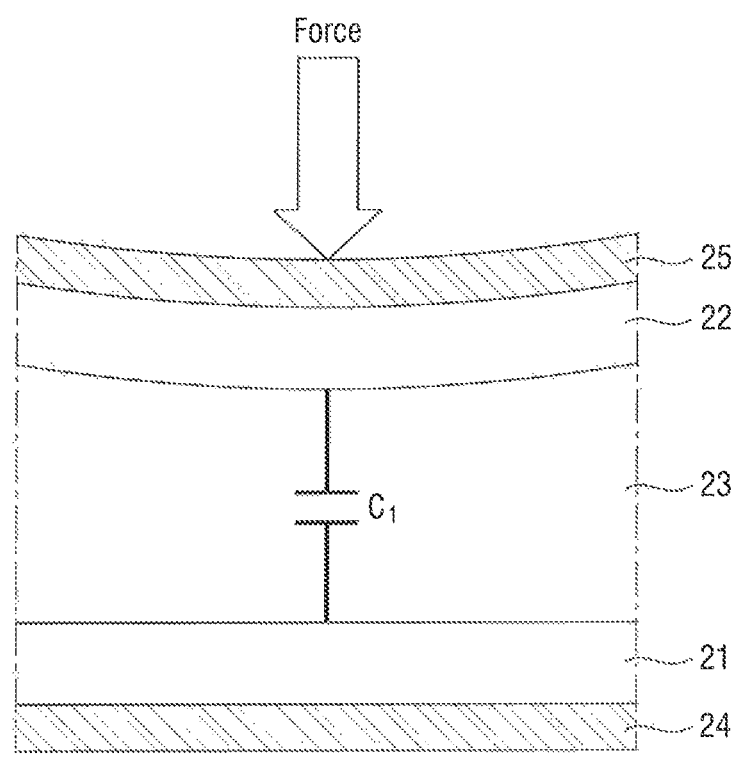

The pressure sensor 20 will now be described in more detail with reference to FIGS. 5 and 6. FIGS. 5 and 6 illustrate operation of the pressure sensor 20 of FIG. 1. FIG. 5 is a cross-sectional view of the pressure sensor 20 in an initial state without pressure. FIG. 6 is a cross-sectional view of the pressure sensor 20 in a pressurized state.

Referring to FIGS. 5 and 6, according to a current embodiment, the pressure sensor 20 overlaps the display panel 11. For example, the pressure sensor 20 overlaps the light emitting areas EA of the display panel 11. For a more specific example, the pressure sensor 20 overlaps the plurality of photosensors 301, the plurality of light emitting layers 650, and the plurality of light condensers 810. Each of the photosensors 301 are located between the pressure sensor 20 and the light emitting element 600.

According to a current embodiment, the pressure sensor 20 obtains touch pressure information of a user's touch operation. For example, the pressure sensor 20 obtains information about whether the user's touch operation has been accompanied by pressure or information about the magnitude of the pressure accompanying the touch operation.

In an embodiment, the pressure sensor 20 includes a conductive first electrode 21, a conductive second electrode 22 spaced apart from the first electrode 21, and a dielectric layer 23 interposed between the first electrode 21 and the second electrode 22. A ground signal is transmitted to any one of the first electrode 21 and the second electrode 22, and a driving signal is transmitted to the other electrode. The dielectric layer 23 includes an elastic material having a predetermined dielectric constant. For example, the dielectric layer 23 is an elastic layer that is partially compressed when pressure is applied and returns to its original shape when the pressure is removed. That is, the distance between the first electrode 21 and the second electrode 22 of the pressure sensor 20 partially changes according to the presence or absence of pressure, the position to which pressure is applied, or the intensity of the pressure.

According to a current embodiment, the first electrode 21, the second electrode 22, and the dielectric layer 23 interposed between the first electrode 21 and the second electrode 22 form a capacitor. The magnitude of the capacitance formed between the first electrode 21 and the second electrode 22 is determined by the distance between the first electrode 21 and the second electrode 22 and the dielectric constant of the dielectric layer 23 interposed between the first electrode 21 and the second electrode 22. For example, an initial capacitance $C_0$ forms between the first electrode 21 and the second electrode 22 in an initial state in which no pressure is applied to the pressure sensor 20. On the other hand, a pressure capacitance $C_1$ forms between the first electrode 21 and the second electrode 22 in a pressurized state in which pressure is applied to the pressure sensor 20. Although embodiments are not limited to the following case, the pressure sensor 20 can, in a pressurized state, detect a difference ($C_1-C_0$) between the pressure capacitance $C_1$ and the initial capacitance $C_0$ and obtain information about whether the user's touch operation has been accompanied by pressure based on the detected difference. For example, when the difference ($C_1-C_0$) between the pressure capacitance $C_1$ caused by the user's touch operation and the initial capacitance $C_0$ is equal to or greater than a predetermined reference value, such as a threshold value, that is, when effective pressure has been applied, the pressure sensor 20 determines that the touch operation has been accompanied by pressure.

In some embodiments, the pressure sensor 20 further includes a first support layer 24 and a second support layer 25 spaced apart from each other with the first electrode 21, the dielectric layer 23 and the second electrode 22 interposed between them.

As described above, the pressure sensor 20 of the display device 1 according to a current embodiment overlaps the light emitting areas EA and a fingerprint sensor package of the display panel 11. That is, since the pressure sensor 20 for obtaining a user's touch pressure information is disposed in the display area that includes the light emitting areas EA, an area for displaying an image, an area for obtaining touch fingerprint information and an area for obtaining touch pressure information can be unified. In addition, since the interaction between the user and the display device 1 is improved, a more intuitive operation can be expected. Furthermore, both fingerprint information and pressure information can be obtained with only one user access to the touch surface of the display device 1. Although embodiments are not limited to the following case, a fingerprint sensor package of the display device 1 is activated for a predetermined period of time when effective pressure is applied to the pressure sensor 20. In an embodiment, a fingerprint sensor package of the display device 1 is activated only for a period of time during which effective pressure is applied to the pressure sensor 20, or that the pressure sensor 20 performs operations other than activating the fingerprint sensor package.

Hereinbelow, other embodiments will be described. For simplicity, a description of elements substantially identical to those of the display device 1 according to an embodiment of FIG. 1, etc., will be omitted.

Figure 7:
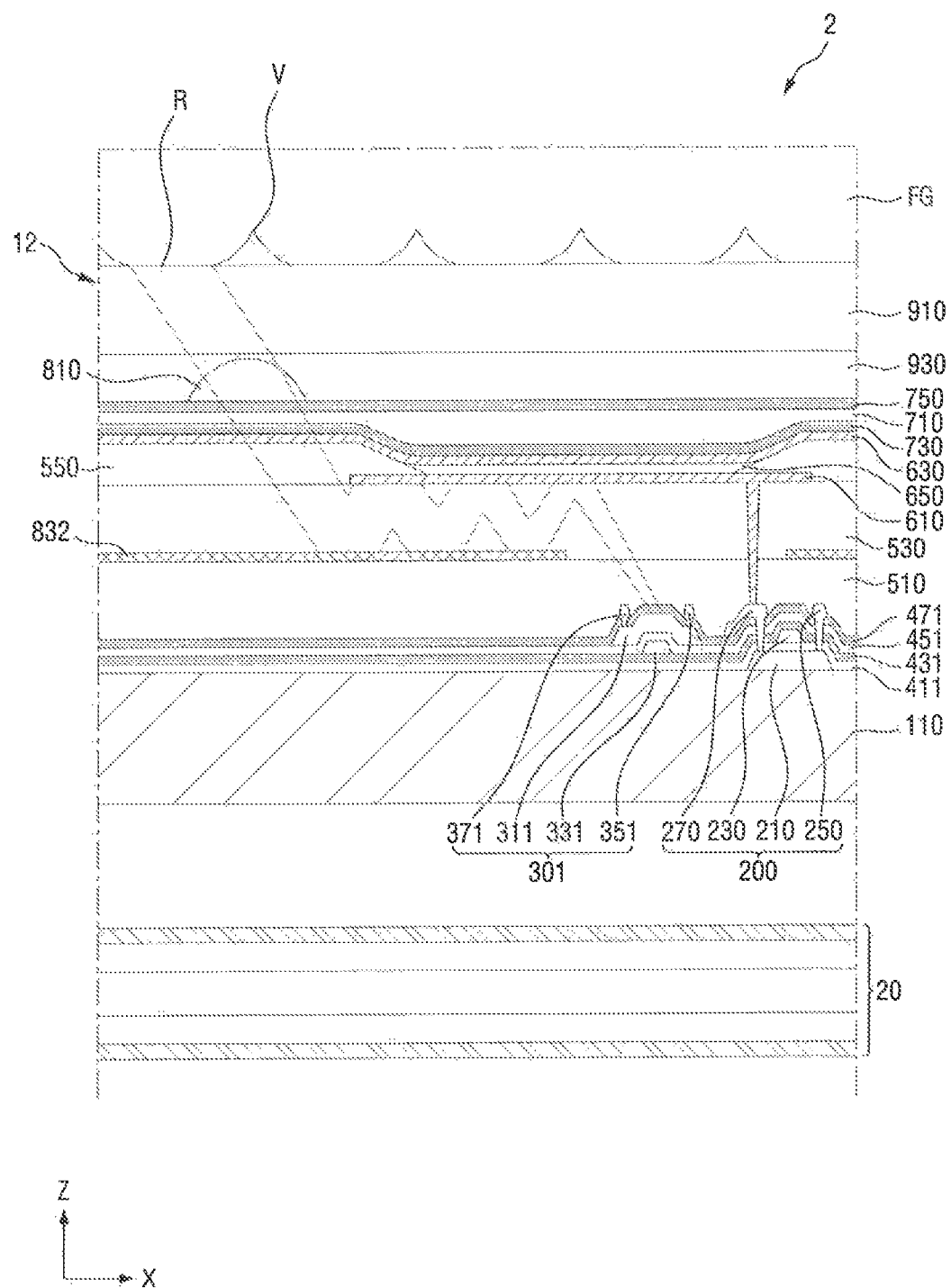
FIG. 7 is a cross-sectional view of a display device according to another embodiment.

FIG. 7 is a cross-sectional view of a display device 2 according to an embodiment.

Referring to FIG. 7, the display device 2 according to the current embodiment differs from the display device 1 according to an embodiment of FIG. 1, in that a reflective layer 832 of a display panel 12 at least partially overlaps a thin film transistor 200.

In an embodiment, the reflective layer 832 is disposed over substantially the entire surface of the display panel 12 rather than having substantially quadrilateral shape in a plan view, and has openings exposing a photosensors 301. That is, the reflective layer 832 at least partially overlaps an anode 610, a light emitting layer 650 and a cathode 630 of a light emitting element 600, a light condenser 810, and the thin film transistor 200. On the other hand, the reflective layer 832 does not overlap a second active layer 311 of the photosensor 301. Accordingly, light reflected by the reflective layer 832 and the anode 610 can propagate toward the photosensor 301.

As described above, according to the current embodiment, the photosensor 301, the reflective layer 832, the light emitting element 600, and the light condenser 810 form a fingerprint sensor package. The display panel 12 and the reflective layer 832 of a fingerprint sensor package have a sufficient area to cover the thin film transistor 200. Thus, it is possible to prevent reflected light, such as light reflected by a user's fingerprint pattern, from unintentionally propagating toward the thin film transistor 200, which would reduce the life of the thin film transistor 200.

Since operation of a fingerprint sensor package and other elements have been described above in an embodiment of FIG. 1, etc., a redundant description thereof is omitted.

Figure 8:
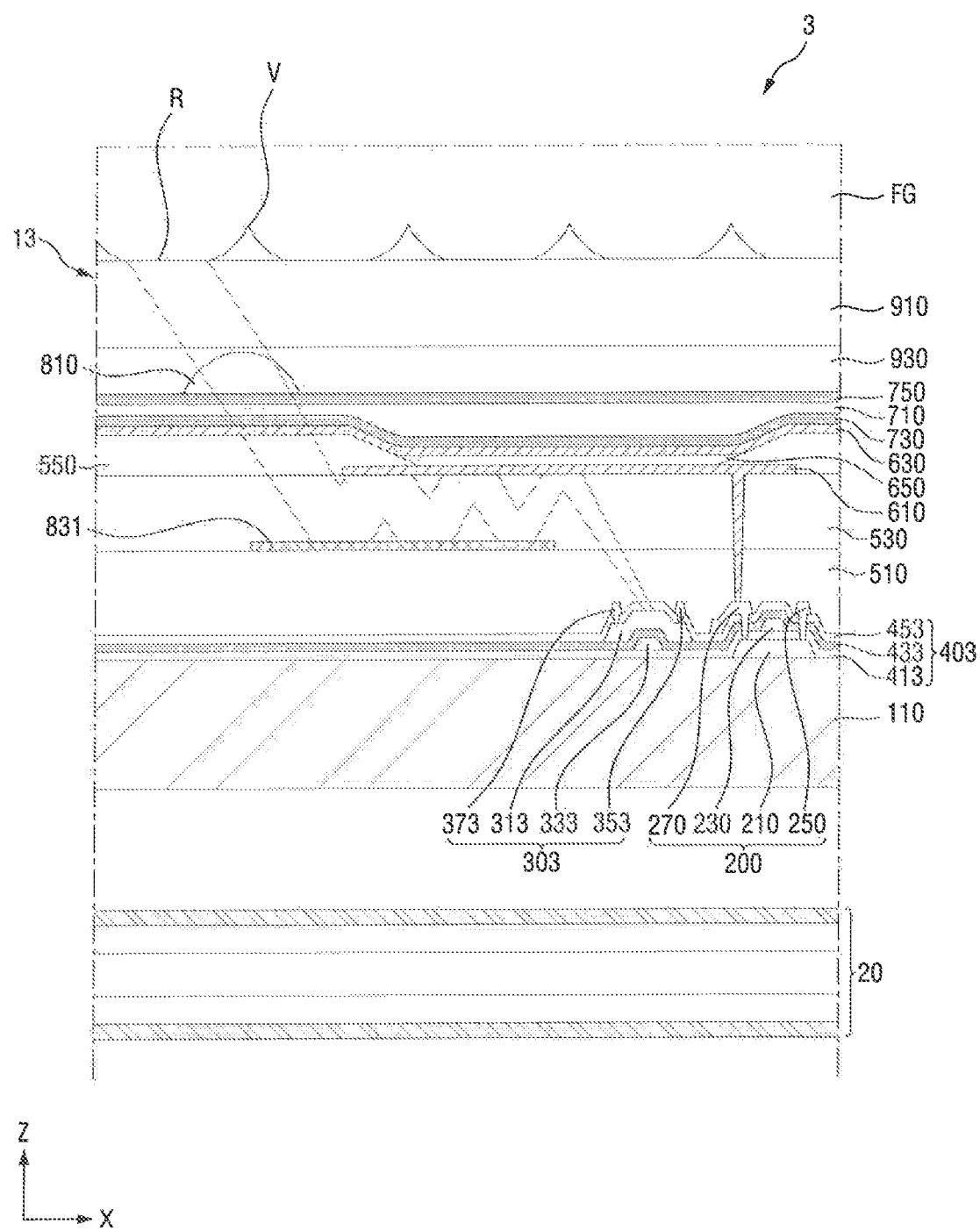
FIGS. 8 through 15 are cross-sectional views of display devices according to other embodiments.

FIG. 8 is a cross-sectional view of a display device 3 according to an embodiment.

Referring to FIG. 8, the display device 3 according to a current embodiment differs from the display device 1 according to an embodiment of FIG. 1, etc., in that a first gate electrode 230 of a thin film transistor 200 and a second gate electrode 333 of a photosensor 303 are located on the same layer.

In an embodiment, the photosensor 303 and the thin film transistor 200 are electrically connected to each other. The first gate electrode 230 of the thin film transistor 200 and the second gate electrode 333 of the photosensor 303 are located on the same layer. For example, the first gate electrode 230 and the second gate electrode 333 include the same material and are formed simultaneously through a single process. In addition, the first gate electrode 230 and the second gate electrode 333 are electrically connected to each other, and the same signal can be simultaneously transmitted to the first gate electrode 230 and the second gate electrode 333.

In addition, according to an embodiment, an interlayer insulating layer 403 is disposed on a base 110 to insulate layers from each other. For example, a first insulating layer 413 is disposed between a first active layer 210 and the first gate electrode 230 to insulate them from each other, in addition, a second insulating layer 433 is disposed between the second gate electrode 333 and a second active layer 313 to insulate them from each other.

In addition, according to an embodiment, a third insulating layer 453 is disposed between the second active layer 313 and a second drain electrode 353 and between the second active layer 313 and a second source electrode 373 to insulate them from each other. The second insulating layer 433 and the third insulating layer 453 insulate the first gate electrode 230 from a first drain electrode 250 and from a first source electrode 270.

As described above, according to an embodiment, the photosensor 303, a reflective layer 831, a light emitting element 600, and a light condenser 810 form a fingerprint sensor package. The first gate electrode 230 and the second gate electrode 333 are electrically connected to each other, and the same signal can be simultaneously transmitted to the first gate electrode 230 and the second gate electrode 333. Therefore, a control signal can be transmitted to the photosensor 303 without a scan wiring for delivering a signal to the photosensor 303. In addition, as described above, the photosensor 303 forms the fingerprint sensor package using a light emitting layer 650 of the light emitting element 600 in an adjacent light emitting area as its light source. That is, without a signal for controlling the photosensor 303, the photosensor 303 can be activated only when a signal is transmitted to the first gate electrode 230 of the thin film transistor 200.

Since an operation of a fingerprint sensor package and other elements have been described above with regard to the embodiment of FIG. 1, etc., a redundant description thereof is omitted.

Figure 9:
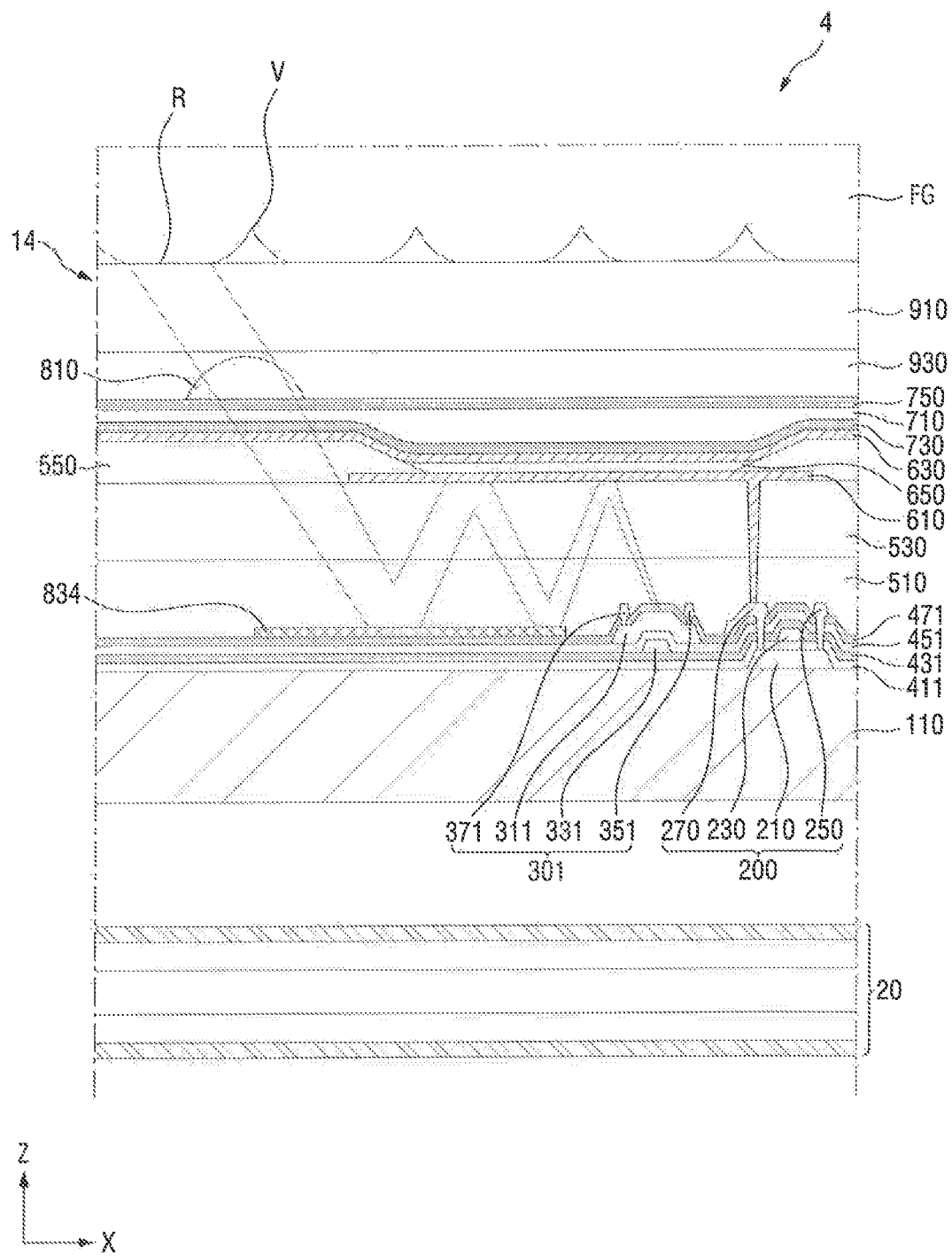

FIG. 9 is a cross-sectional view of a display device 4 according to an embodiment.

Referring to FIG. 9, the display device 4 according to a current embodiment differs from the display device 1 according to an embodiment of FIG. 1, etc., in that a reflective layer 834 of a display panel 14 is disposed between an interlayer insulating layer 401 and a step difference compensating layer 500.

In an embodiment, the reflective layer 834 is disposed directly on the interlayer insulating layer 401. For example, the reflective layer 834 is in contact with a fourth insulating layer 471 of the interlayer insulating layer 401 and a first step difference compensating layer 510. Since the reflective layer 834 is disposed below the step difference compensating layer 500, a vertical distance between a light condenser 810 and the reflective layer 834 is increased.

As described above, according to an embodiment, a photosensor 301, the reflective layer 834, a light emitting element 600, and the light condenser 810 form a fingerprint sensor package. The reflective layer 834 is sufficiently distant from the light condenser 810 to facilitate tuning the incident angle range of reflected light received by the photosensor 301. For example, the photosensor 301 can receive only light propagating at an angle of 41.0 to 48.0 degrees with respect to a normal to a surface of a cover glass 910.

In addition, according to an embodiment, the number of times that light focused by the light condenser 810 is reflected by the reflective layer 834 and an anode 610 of the light emitting element 600 can be reduced, which minimizes light lost in the reflection process. Therefore, the photosensor 301 can obtain clearer fingerprint image information with improved contrast. Furthermore, it is possible to reduce the length of an optical path along which light focused by the light condenser 810 propagates to be reflected by the reflective layer 834 and the anode 610 of the light emitting element 600 and thus minimize the light absorbed by the first step difference compensating layer 510 and a second step difference compensating layer 530.

Since operation of the fingerprint sensor package and other elements have been described above with regard to an embodiment of FIG. 1, etc., a redundant description thereof is omitted.

Figure 10:
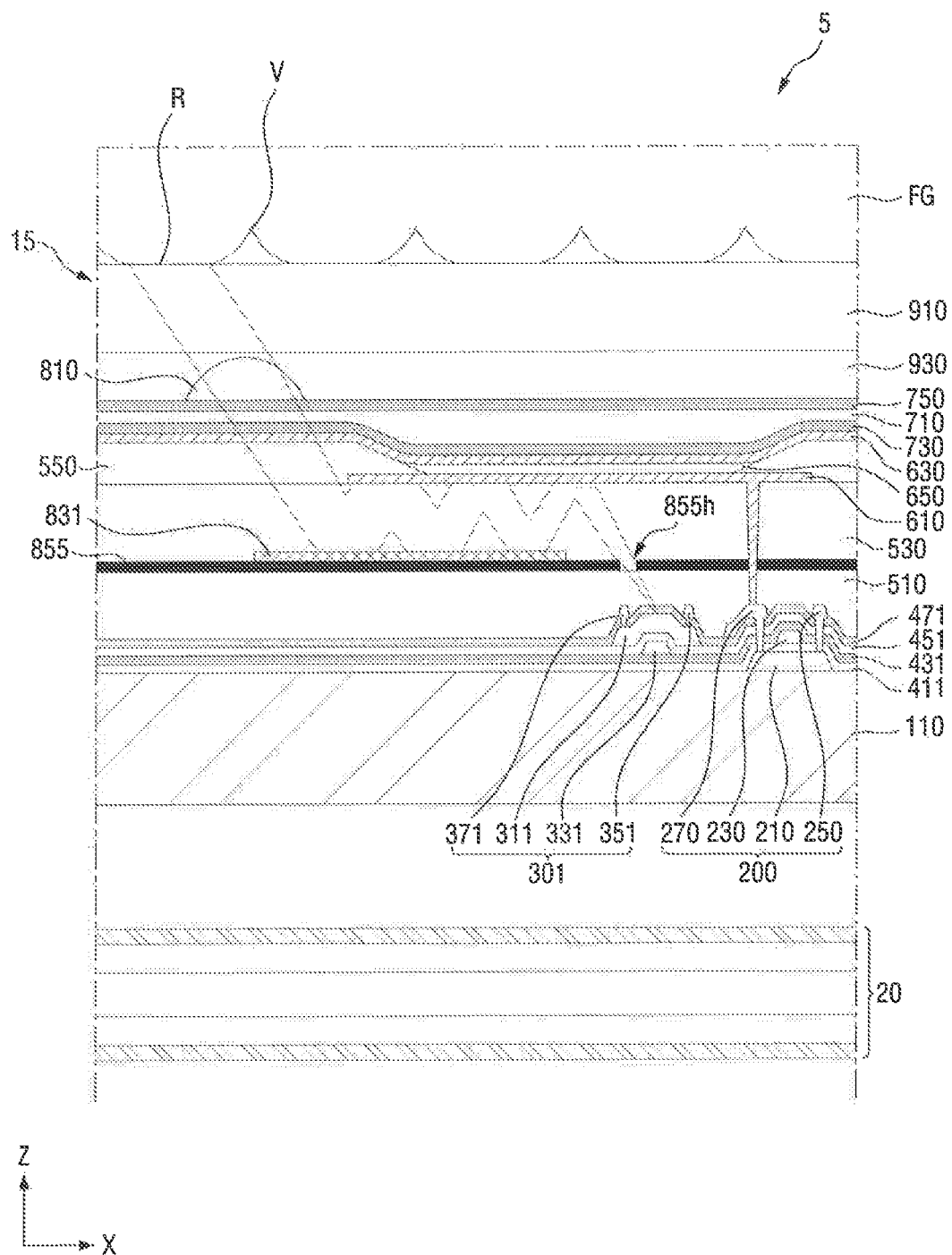

FIG. 10 is a cross-sectional view of a display device 5 according to an embodiment.

Referring to FIG. 10, according to an embodiment, the display device 5 according to a current embodiment differs from the display device 1 according to an embodiment of FIG. 1, etc., in that a display panel 15 and a fingerprint sensor package further include a light-shielding pattern layer 855 that has a pinhole 855h.

In an embodiment, the light-shielding pattern layer 855 is disposed between a base 110 and a reflective layer 831. For example, the light-shielding pattern layer 855 is disposed between a first step difference compensating layer 510 and a second step difference compensating layer 530. The light-shielding pattern layer 855 includes a material that blocks light transmission. For example, the light-shielding pattern layer 855 includes an organic material that contains a light-shielding colorant such as a black pigment or black dye or includes a light-shielding metal.

According to an embodiment, the light-shielding pattern layer 855 is disposed over substantially the entire surface of the display panel 15. In addition, the light-shielding pattern layer 855 has pinhole 855h. Pinhole 855h has a substantially circular shape or a polygonal shape, such as a quadrilateral, in a plan view. Pinhole 855h is positioned in a path along which light reflected by an anode 610 propagates toward a photosensor 301. For example, the pinhole 855h does not overlap the reflective layer 831 and overlaps the anode 610 of a light emitting element 600. In some embodiments, a plurality of light-shielding pattern layers 855 are disposed between the reflective layer 831 and the base 110.

The photosensor 301, the reflective layer 831, the light emitting element 600, a light condenser 810, and the light-shielding pattern layer 855 according to a current embodiment form a fingerprint sensor package. The light-shielding pattern layer 855 and the pinhole 855h facilitate the tuning of an incident angle range of reflected light received by the photosensor 301. For example, the photosensor 301 can receive only light propagating at an angle of 41.0 to 48.0 degrees with respect to a normal to a surface of a cover glass 910. The light-shielding pattern layer 855 blocks light propagating at an angle outside the above range from propagating toward the photosensor 301. Furthermore, since light focused by, the light condenser 810 propagates through the pinhole 855h of the light-shielding pattern layer 855, image contrast obtained by the photosensor 301 and the fingerprint sensor package can be further improved.

Since operation of a fingerprint sensor package and other elements have been described above in an embodiment of FIG. 1, etc., a redundant description thereof is omitted.

Figure 11:
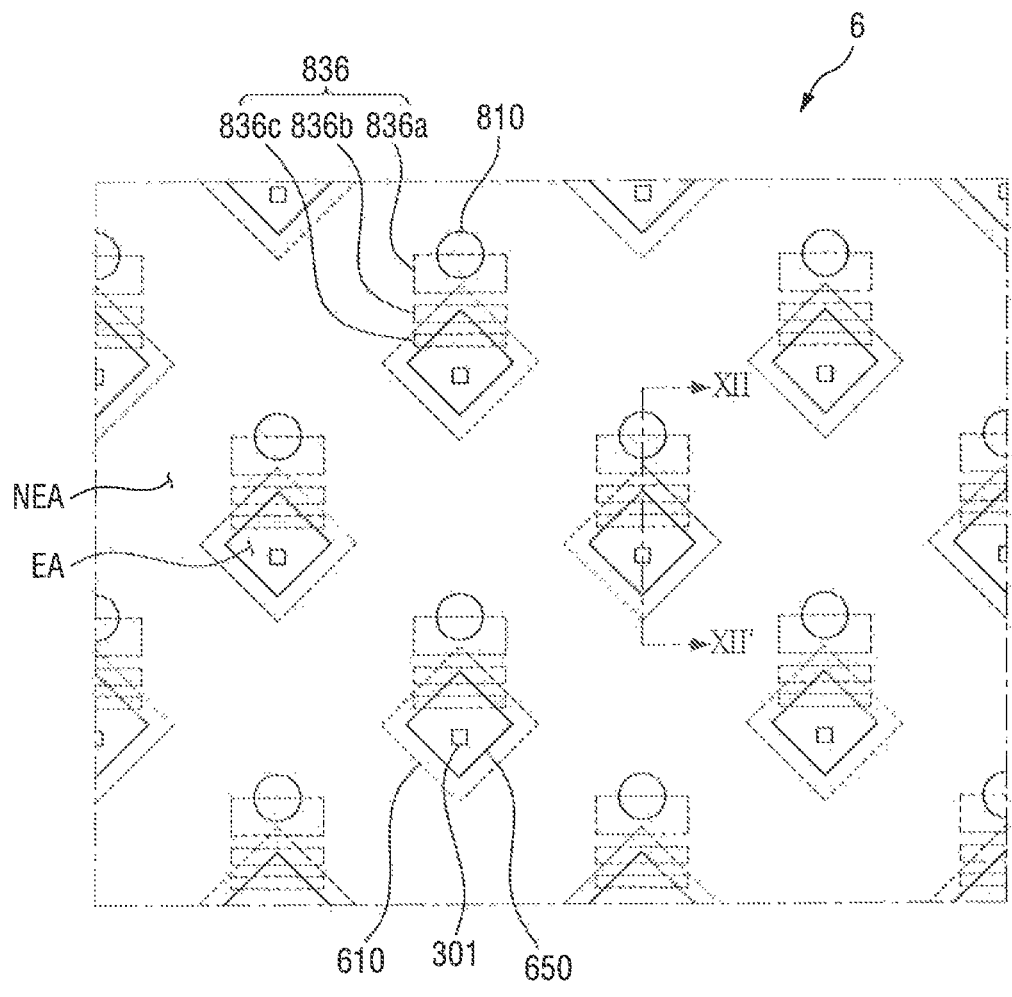
Figure 12:
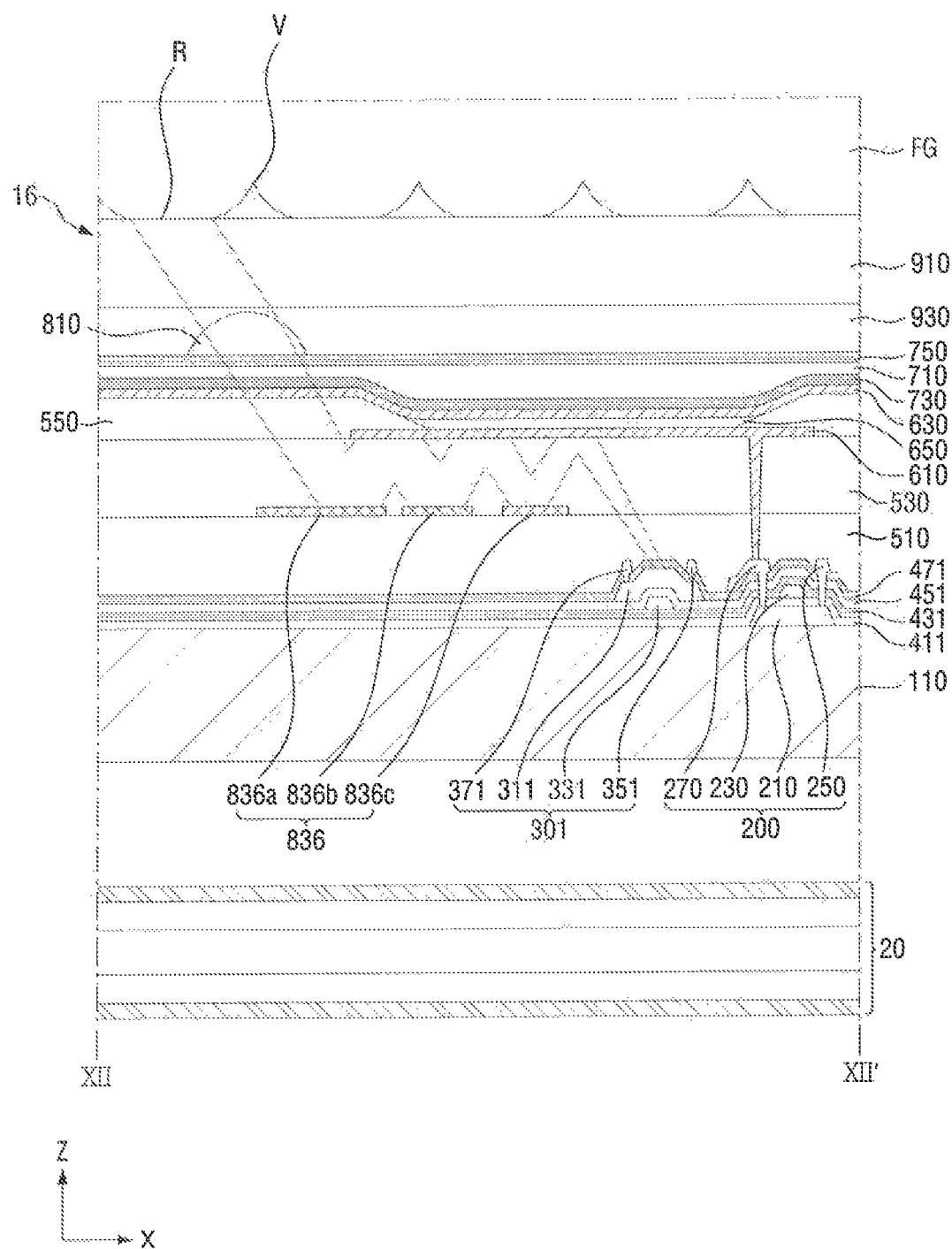

FIG. 11 is a plan view of a display device 6 according to an embodiment, illustrating the planar arrangement of a light emitting layer 650, an anode 610, a photosensor 301, a reflective layer 836 and a light condenser 810. FIG. 12 is a cross-sectional view of the display device 6 of FIG. 11, taken along the line XII-XII'.

Referring to FIGS. 11 and 12, the display device 6 according to a current embodiment differs from a display device 1 according to an embodiment of FIG. 1, etc., in that the reflective layer 836 of a display panel 16 includes a plurality of sub-reflective layers spaced apart from each other.

In an embodiment, the reflective layer 836 includes a plurality of reflective layers spaced apart from each other in the light focusing direction of the light condenser 810. For example, the reflective layer 836 includes a first sub-reflective layer 836a, a second sub-reflective layer 836b, and a third sub-reflective layer 836c spaced apart from each other in the first direction X.

According to an embodiment, the first sub-reflective layer 836a is disposed in a non-light emitting area NEA. For example, the first sub reflective layer 836a at least partially overlaps the light condenser 810 and the anode 610. On the other hand, the first sub-reflective layer 836a does overlap the light emitting layer 650. In some embodiments, the first sub-reflective layer 836a is completely overlapped by a pixel defining layer 550.

In addition, according to an embodiment, at least a portion of the second sub-reflective layer 836b is disposed in each light emitting area EA, and a portion of the second sub-reflective layer 836b is disposed in the non-light emitting area NEA. For example, the second sub reflective layer 836b at least partially overlaps the light emitting layer 650 and the pixel defining layer 550. On the other hand, the second sub-reflective layer 836b does not overlap the light condenser 810.

According to an embodiment, at least a portion of the third sub-reflective layer 836c is disposed in each light emitting area EA. For example, the third sub-reflective layer 836c at least partially overlaps the light emitting layer 650 but does not overlap the photosensor 301. In some embodiments, an overlap area of the third sub-reflective layer 836c and the light emitting layer 650 is greater than an overlap area of the second sub-reflective layer 836b and the light emitting layer 650.

In an embodiment, the first sub reflective layer 836a, the second sub-reflective layer 836b or the third sub-reflective layer 836c have different widths in the X-direction.

In the display device 6 according to a current embodiment, a plurality of sub-reflective layers 836a, 836b and 836c are disposed in one pixel that is independently controlled, that is, in one light emitting area EA. More specifically, one photosensor 301 receives light reflected by a plurality of sub-reflective layers 836a, 836b and 836c.

As described above, according to an embodiment, the reflective layer 836 reflects light focused by the light condenser 810 toward the photosensor 301. In this case, the first sub-reflective layer 836a, the second sub-reflective layer 836b and the third sub-reflective layer 836c are disposed at pre-tuned locations, that is, at locations where the focused light is reflected, and no reflective layer is disposed in other areas. Accordingly, this can facilitate the tuning of the incident angle range of the reflected light received by the photosensor 301. For example, the photosensor 301 can receive light propagating at an angle of 41.0 to 48.0 degrees with respect to a normal to a surface of a cover glass 910, and reflection of light at an unintended angle can be prevented, thereby minimizing image noise obtained by the photosensor 301.

Since operation of a fingerprint sensor package and other elements have been described above with regard to an embodiment of FIG. 1, etc., a redundant description thereof is omitted.

Figure 13:
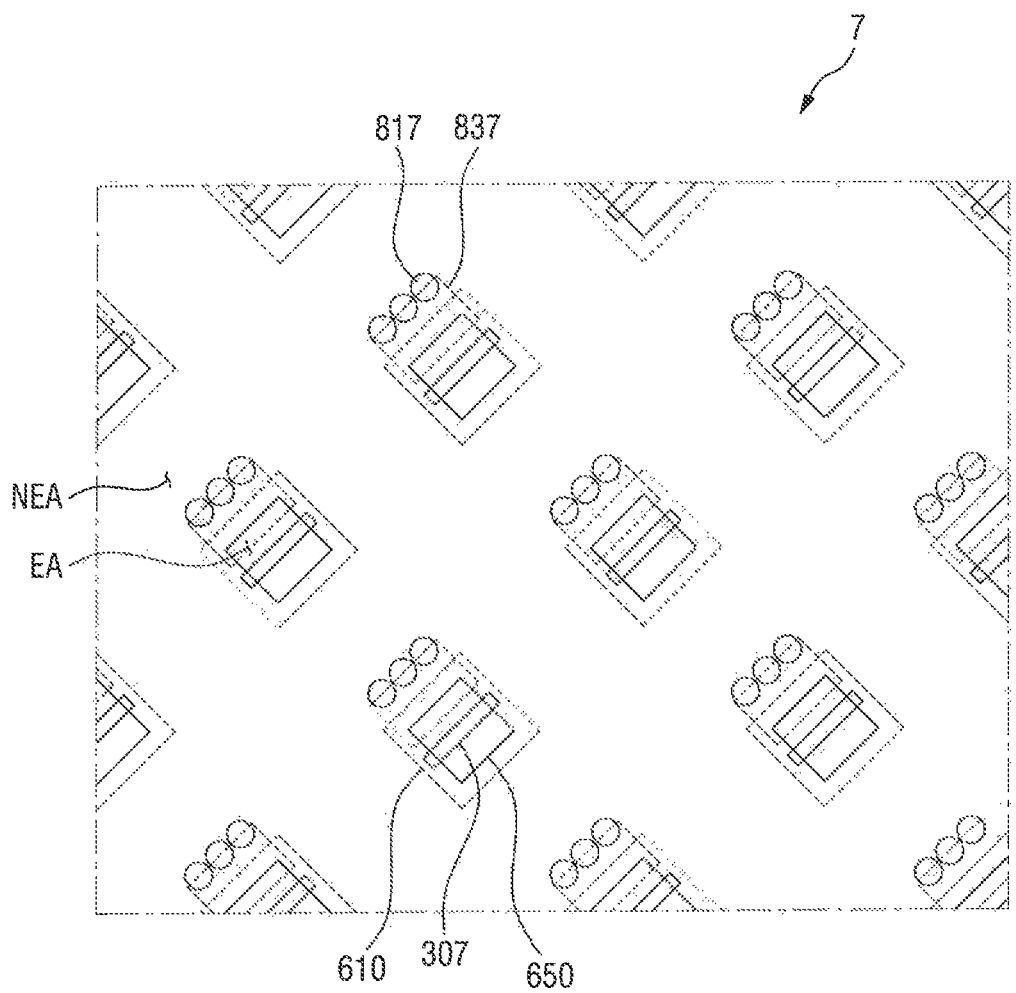

FIG. 13 is a plan view of a display device 7 according to an embodiment, and illustrates a planar arrangement of a light emitting layer 650, an anode 610, a photosensor 307, a reflective layer 837 and a light condenser 817.

Referring to FIG. 13, the display device 7 according to a current embodiment differs from the display device 1 according to an embodiment of FIG. 1, etc., in that the light condenser 817 has an optical interface that focuses of light propagating in at least a first oblique direction OD1. The first oblique direction OD1 is a direction that intersects the first direction X and the second direction Y in a plane.

In an embodiment, a display panel of the display device 7 includes a plurality of light omitting areas EA spaced apart from each other in the first direction X and the second direction Y, and the light condenser 817 focuses light propagating in the first oblique direction OD1. In an embodiment in which the light emitting areas EA each have a substantially diamond shape in a plan view, the light condenser 817 is disposed adjacent to a side of the diamond shape.

According to an embodiment, the light condenser 817 at least partially overlaps the reflective layer 837. The light condenser 817 does not overlap the light emitting layer 650 and the anode 510 of a light emitting element. For example, the light condenser 817 is spaced apart from the light emitting layer 650 and the anode 610 in the first oblique direction OD1.

In some embodiments, a plurality of light condensers 817 are provided and repeated in a second oblique direction OD2. The second oblique direction OD2 is another direction intersecting the first direction X, the second direction Y and the first oblique direction OD1 in a plane. In an embodiment in which the light emitting areas EA each have a substantially diamond shape in a plan view, a plurality of light condensers 817 are disposed adjacent to each other in a direction substantially parallel to a side of the diamond shape. As a non-limiting example, the number of the light condensers 817 of the display panel of the display device 7 is greater than the number of the reflective layers 837.

In addition, according to an embodiment, the photosensor 307 extends substantially in the second oblique direction OD2. At least a portion of the photosensor 307 is disposed within a non-light emitting area NEA. In addition, in an embodiment in which the photosensor 307 is a phototransistor, a second active layer of the photosensor 307 has a sufficient area in the second oblique direction OD2.

In the display device 7 according to a current embodiment, a plurality of light condensers 817 are disposed in one independently controlled pixel, that is, in one light emitting area EA. More specifically, one photosensor 307 receive light focused by a plurality of light condensers 817. The light condensers 817 increase the intensity of light that propagates in a specific direction, i.e., the first oblique direction OD1, and increase the intensity of light received by the photosensor 307, thereby improving a sensing sensitivity of a fingerprint sensor package.

Since operation of the fingerprint sensor package and other elements have been described above with regard to an embodiment of FIG. 1, etc., a redundant description thereof is omitted.

Figure 14:
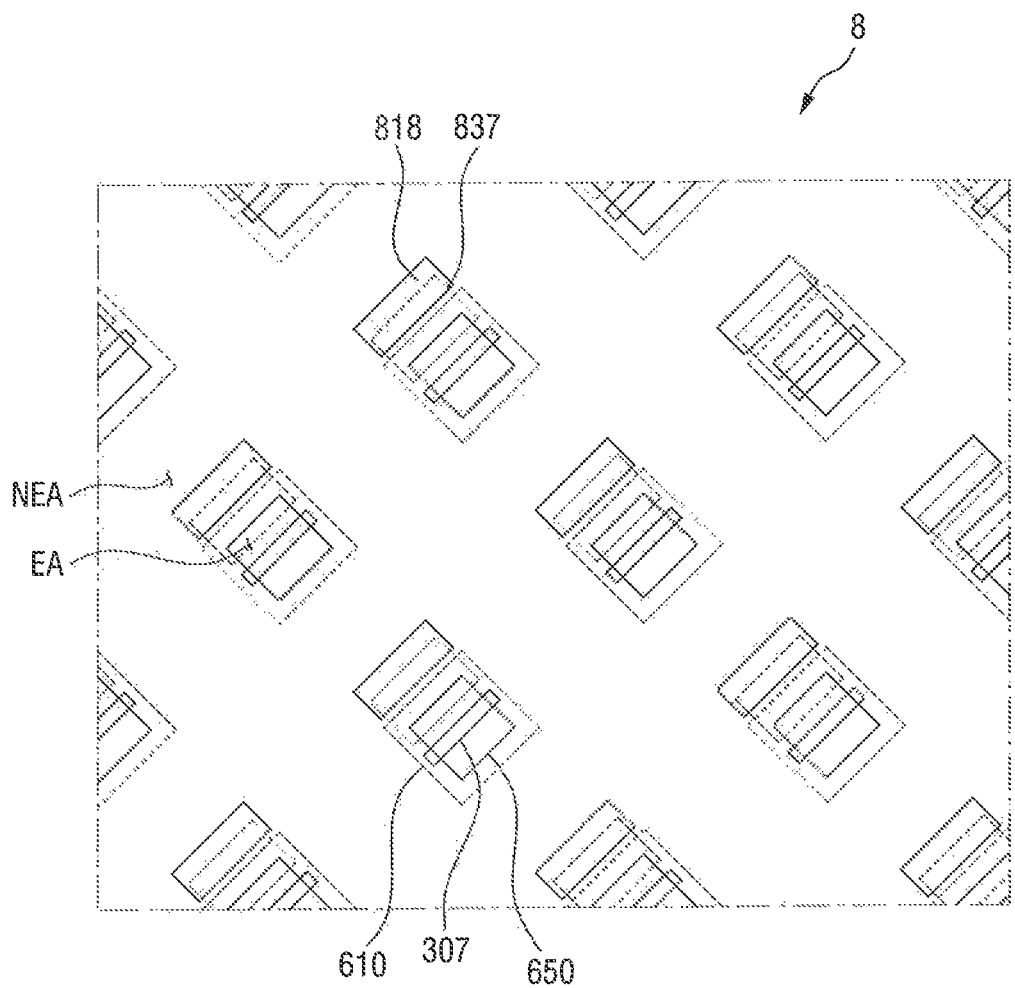
Figure 15:
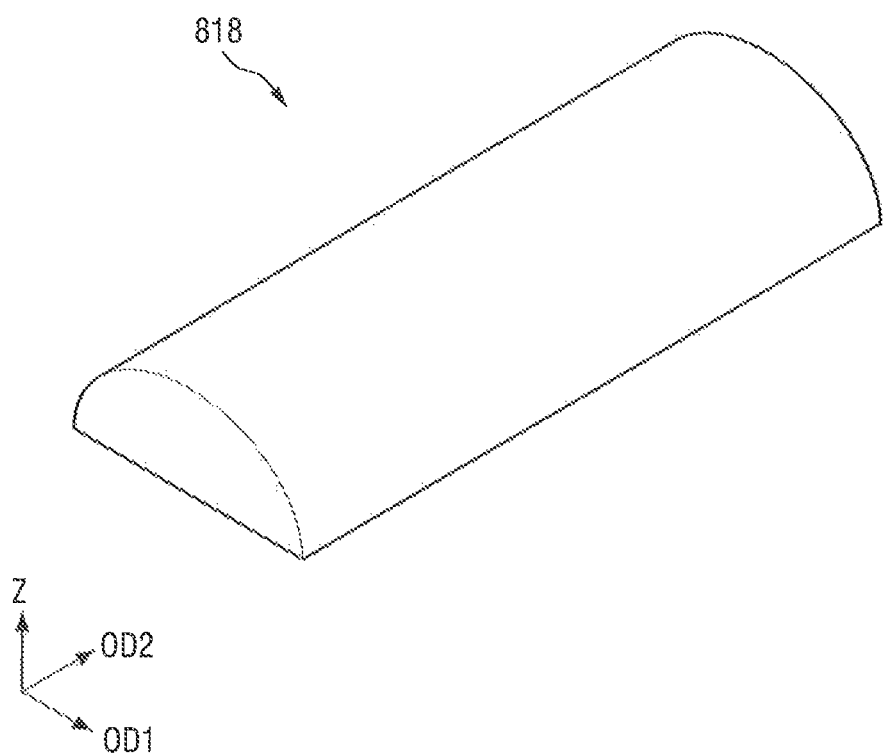

FIG. 14 is a plan view of a display device 8 according to an embodiment that illustrates a planar arrangement of a light emitting layer 650, an anode 610, a photosensor 307, a reflective layer 837, and a light condenser 818. FIG. 15 is a perspective view of the light condenser 818 of the display device 8 of FIG. 14.

Referring to FIGS. 14 and 15, the display device 8 according to a current embodiment differs from the display device 7 according to an embodiment of FIG. 13, etc., in that the light condenser 818 of a display panel has an optical interface that extends in the second oblique directions OD2 and focuses light propagating in the first oblique direction OD1.

In an embodiment, the light condenser 818 is a lenticular lens that extends in the second oblique direction OD2 and has an optical interface that focuses light propagating in the first oblique direction OD1. In an embodiment in which each light emitting area EA has a substantially diamond shape in a plan view, the light condenser 818 is disposed adjacent to a side of the diamond shape.

Since operation of a fingerprint sensor package and other elements have been described above with regard to an embodiment of FIG. 13, etc., a redundant description thereof is omitted.

Hereinafter, the present disclosure will be described in more detail by additionally referring to Examples and Comparative Examples.

EXAMPLE 1

A fingerprint sensor package having a structure of FIG. 3 described above and a display panel that includes the fingerprint sensor package were manufactured. A fingerprint sensor package includes a phototransistor that receives light incident at an angle of 41.0 to 48.0 degrees by tuning the distance and arrangement relationships of a microlens, a reflective layer, an anode of a light emitting element, and the phototransistor. In Example 1, a vertical distance from the microlens to the reflective layer and a vertical distance from the reflective layer to the phototransistor were about 1:1. The contrast of a fingerprint image obtained by a fingerprint sensor package according to Example 1 was measured, and the result is shown in Table 1.

EXAMPLE 2

A fingerprint sensor package having a structure of FIG. 9 described above and a display panel that includes the fingerprint sensor package were manufactured. In Example 2, a vertical distance from a microlens to a reflective layer and a vertical distance from the microlens to a phototransistor were about 1:1. That is, the reflective layer and the phototransistor were placed at substantially the same level. The contrast of a fingerprint image obtained by a fingerprint sensor package according to Example 2 was measured, and the result is shown in Table 1.

EXAMPLE 3

A fingerprint sensor package having a structure of FIG. 10 described above and a display panel that includes the fingerprint sensor package were manufactured. That is, the fingerprint sensor package and the display panel were manufactured in the same manner as in Example 1, except that a light-shielding pattern layer that has a pinhole was formed on an optical path that extends from an anode to a phototransistor. Then, the contrast of a fingerprint image obtained by a fingerprint sensor package according to Example 3 was measured, and the result is shown in Table 1.

Comparative Example 1

A fingerprint sensor package having a same structure as that of Example 1 except that no microlens or reflective layer were formed and a display panel that includes the fingerprint sensor package were manufactured. Then, the contrast of a fingerprint image obtained by a fingerprint sensor package according to Comparative Example 1 was measured, and the result is shown in Table 1.

Comparative Example 2

A fingerprint sensor package having the same structure as that of Example 3 except that no microlens or reflective layer were formed and a display panel that includes the fingerprint sensor package were manufactured. Then, the contrast of a fingerprint image obtained by a fingerprint sensor package according to Comparative Example 2 was measured, and the result is shown in Table 1.

TABLE 1

|  | Comparative Example 1 | Comparative Example 2 | Example 1 | Example 2 | Example 3 |
| --- | --- | --- | --- | --- | --- |
| Contrast | 0.13 | 0.14 | 0.53 | 0.61 | 0.67 |

Referring to Table 1, it can be seen that Comparative Example 1 and Comparative Example 2, which lack a microlens and a reflective layer, have very low contrast. On the other hand, it can be seen that Examples 1 through 3, in which light was focused using a microlens and the focused light is guided toward a phototransistor using a reflective layer and an anode, have remarkably improved contrast.

Fingerprint sensor packages and display devices according to embodiments can obtain a user's fingerprint information with improved contrast and have improved fingerprint sensing sensibility.

However, effects of embodiments are not restricted to those set forth herein. The above and other effects of exemplary embodiments will become more apparent to one of ordinary skill in the art to which the embodiments pertain by referencing the claims.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device, comprising:
    a base;
    photosensor disposed on a surface of the base;
    a light emitting element disposed on the photosensor that comprises a bottom electrode, an upper electrode and a light emitting layer interposed between the bottom electrode and the upper electrode; and
    a light condenser disposed on the light emitting element, wherein the light condenser does not overlap the bottom electrode in a plan view, wherein
    the light condenser overlaps the upper electrode and is not disposed in a light emitting area of the display device, and
    the photosensor overlaps the bottom electrode and the light emitting layer.

2. The display device of claim 1, further comprising
    a pixel defining layer disposed on the photosensor that has an opening that partially exposes the bottom electrode,
    wherein the light condenser is disposed on the pixel defining layer and overlaps the pixel defining layer.

3. The display device of claim 1, wherein the photosensor receives light focused by the light condenser and at least a portion of light emitted from the light emitting layer and then reflected by a fingerprint of a user.

4. The display device of claim 3, wherein a focus of the light condenser for Light incident from above the light condenser is located below the surface of the base.

5. The display device of claim 3, further comprising
    a cover glass disposed on the light condenser and receives the fingerprint of the user,
    wherein the photosensor receives light propagating at an angle of 41.0 to 48.0 degrees with respect to a normal to a surface of the cover glass of the light reflected by the fingerprint of the user.

6. The display device of claim 1, further comprising
    a reflective layer disposed between the base and the light emitting element that at least partially overlaps the light condenser, and
    a thin film transistor disposed on the surface of the base that is electrically connected to the light emitting element.

7. The display device of claim 6, further comprising
    a first step difference compensating layer disposed between the thin film transistor and the light emitting element that includes a first contact hole; and
    a second step difference compensating layer disposed between the first step difference compensating layer and the light emitting element that includes a second contact hole connected to the first contact hole and is in contact with the bottom electrode,
    wherein the reflective layer is disposed between the first step difference compensating layer and the second step difference compensating layer.

8. The display device of claim 6, wherein the reflective layer at least partially overlaps the bottom electrode and the light emitting layer.

9. The display device of claim 8, wherein the reflective layer overlaps the thin film transistor and does not overlap the photosensor.

10. The display device of claim 6, wherein
the photosensor receives light focuses by the light condenser,
the light focused by the light condenser propagates toward the reflective layer and is reflected by the reflective layer,
the light reflected by the reflective layer propagates toward the bottom electrode and is reflected by the bottom electrode, and
the light reflected by the bottom electrode propagates toward the photosensor.

11. The display device of claim 6, further comprising
a light-shielding pattern layer disposed between the base and the reflective layer and that includes a pinhole,
wherein the pinhole does not overlap the reflective layer and overlaps the light emitting element.

12. The display device of claim 6,
wherein the thin film transistor is a top gate type first thin film transistor that comprises a first gate electrode, a first active layer, a first drain electrode and a first source electrode,
wherein the photosensor comprises a bottom gate type second thin film transistor that includes a second gate electrode, a second active layer, a second drain electrode and a second source electrode, and
the reflective layer is insulated from the first thin film transistor and the second thin film transistor.

13. The display device of claim 12, wherein
the first thin film transistor and the second thin film transistor are insulated from each other,
the first gate electrode and the second gate electrode are disposed in different layers, and
the first drain electrode, the first source electrode, the second drain electrode and the second source electrode are disposed in the same layer.

14. The display device of claim 12, wherein the first gate electrode and the second gate electrode are electrically connected to each other.

15. The display device of claim 1, further comprising:
a plurality of the photosensors, a plurality of the light emitting layers, and a plurality of the light condensers,
wherein the photosensors, the light emitting layers and the light condensers are respectively spaced apart from each other in a first direction and a second direction that intersects the first direction,
wherein the light condensers focus light propagating, in a first direction.

16. The display device of claim 15, further comprising
a pressure sensor that overlaps the photosensors, the light emitting layers and the light condensers,
wherein the pressure sensor is spaced apart from the light emitting element with the photosensor interposed between the pressure sensor and the light emitting element.

17. A display device, comprising:
a base;
a photosensor disposed on a surface of the base;
a light emitting element disposed on the photosensor;
a light condenser disposed on the light emitting element; and
at least one reflective layer disposed between the base and the light emitting element that at least partially overlaps the light condenser,
wherein the photosensor receives light focused by the light condenser and reflected by the at least one reflective layer and a lower surface of the light emitting element.

18. The display device of claim 17, wherein
the light emitting element comprises a bottom electrode, an upper electrode and a light emitting layer interposed between the bottom electrode and the upper electrode, and
the light focused by the fight condenser is reflected the reflective layer and the bottom electrode as said light propagates to the photosensor.

19. A fingerprint sensor package, comprising:
a plurality of light sources that are spaced apart from each other in a first direction and a second direction that intersects the first direction and that emit light toward at least front surfaces of the light sources;
a plurality of light condensers disposed on front surfaces of the light sources, are spaced apart from each other in the first direction, and that focus light propagating in a first direction;
a plurality of photosensors disposed on rear surfaces of the light sources, are spaced apart from each other in the first direction, and that receive light focused by the light condensers; and
a pressure sensor that overlaps the plurality of photosensors, the plurality of light sources and the plurality of light condensers,
wherein the pressure sensor is spaced apart from the plurality of light sources with the plurality of photosensors interposed between the pressure sensor and the plurality of light sources.

* * * * *